United States Patent
Nakamura et al.

(10) Patent No.: US 7,042,061 B2
(45) Date of Patent: *May 9, 2006

(54) SOLID-STATE IMAGE PICKUP APPARATUS

(75) Inventors: Nobuo Nakamura, Yokohama (JP); Hisanori Ihara, Yokohama (JP); Ikuko Inoue, Kawasaki (JP); Hidenori Shibata, Kawasaki (JP); Akiko Nomachi, Yokohama (JP); Yoshiyuki Shioyama, Kawasaki (JP); Hidetoshi Nozaki, Yokohama (JP); Masako Hori, Kawasaki (JP); Akira Makabe, Kawasaki (JP); Hiroshi Naruse, Yokohama (JP); Hideki Inokuma, Yokohama (JP); Seigo Abe, Oita (JP); Hirofumi Yamashita, Cambridge, MA (US); Tetsuya Yamaguchi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/727,515

(22) Filed: Dec. 5, 2003

(65) Prior Publication Data

US 2004/0108502 A1    Jun. 10, 2004

Related U.S. Application Data

(62) Division of application No. 09/272,337, filed on Mar. 19, 1999, now Pat. No. 6,690,423.

(30) Foreign Application Priority Data

| Mar. 19, 1998 | (JP) | 10-070801 |
| Mar. 19, 1998 | (JP) | 10-070892 |
| Mar. 31, 1998 | (JP) | 10-087380 |

(51) Int. Cl.
*H01L 31/06* (2006.01)
*H01L 27/148* (2006.01)

(52) U.S. Cl. .................. 257/461; 257/462; 257/215
(58) Field of Classification Search ............ 257/443, 257/461, 462, 215; 348/311
See application file for complete search history.

(56) References Cited

U.S. PATENT DOCUMENTS

| 4,521,804 | A | 6/1985 | Bendell |
| 5,477,070 | A | 12/1995 | Nam |
| 5,675,158 | A | 10/1997 | Lee |
| 5,753,958 | A | 5/1998 | Burr et al. |
| 6,121,666 | A | 9/2000 | Burr |
| 6,690,423 | B1 * | 2/2004 | Nakamura et al. .......... 348/311 |
| 2004/0108502 | A1 | 6/2004 | Nakamura et al. |
| 2005/0242385 | A1 | 11/2005 | Yamaguchi et al. |

FOREIGN PATENT DOCUMENTS

| JP | 3-261172 | 11/1991 |
| JP | 04-098878 | 3/1992 |
| JP | 4-332166 | 11/1992 |
| JP | 5-75089 | 3/1993 |
| JP | 6-244398 | 9/1994 |
| JP | 7-142696 | 6/1995 |

OTHER PUBLICATIONS

R.M. Guidash, et al., A 0.6 um CMOS Pinned Photodiode Color Imager Technology', IEDM, 1997, pp. 927-929.

* cited by examiner

*Primary Examiner*—Steven Loke
(74) *Attorney, Agent, or Firm*—Oblon, Spivak, McClelland, Maier & Neustadt, P.C.

(57) ABSTRACT

The present invention provides a solid-state image pickup apparatus which is able to easily discharge signal charges in a signal accumulating section and which is free from reduction in the dynamic range of the element, thermal noise in a dark state, an image-lag and so forth even if the pixel size of the MOS solid-state image pickup apparatus is reduced, the voltage of a reading gate is lowered and the concentration in the well is raised. The solid-state image pickup apparatus according to the present invention incorporates a p-type silicon substrate having a surface on which a $p^+$ diffusion layer for constituting a photoelectric conversion region and a drain of a reading MOS field effect transistor are formed. A signal accumulating section formed by an n-type diffusion layer is formed below the $p^+$ diffusion layer. A gate electrode of the MOS field effect transistor is, on the surface of the substrate, formed between the $p^+$ diffusion layer and the drain. The position of an end of the signal accumulating section adjacent to the gate electrode of the MOS transistor extends over the end of the reading gate electrode of the $p^+$ diffusion layer to a position below the gate electrode.

10 Claims, 17 Drawing Sheets

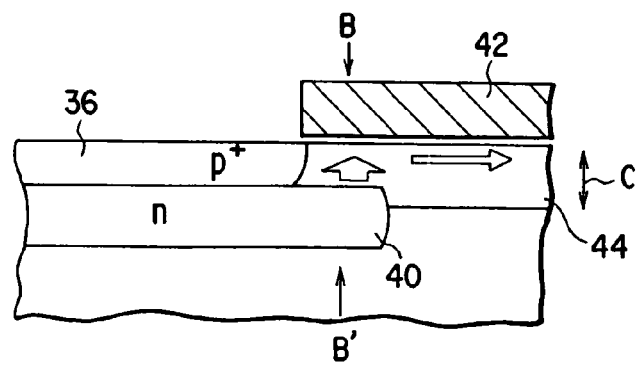
FIG.4A
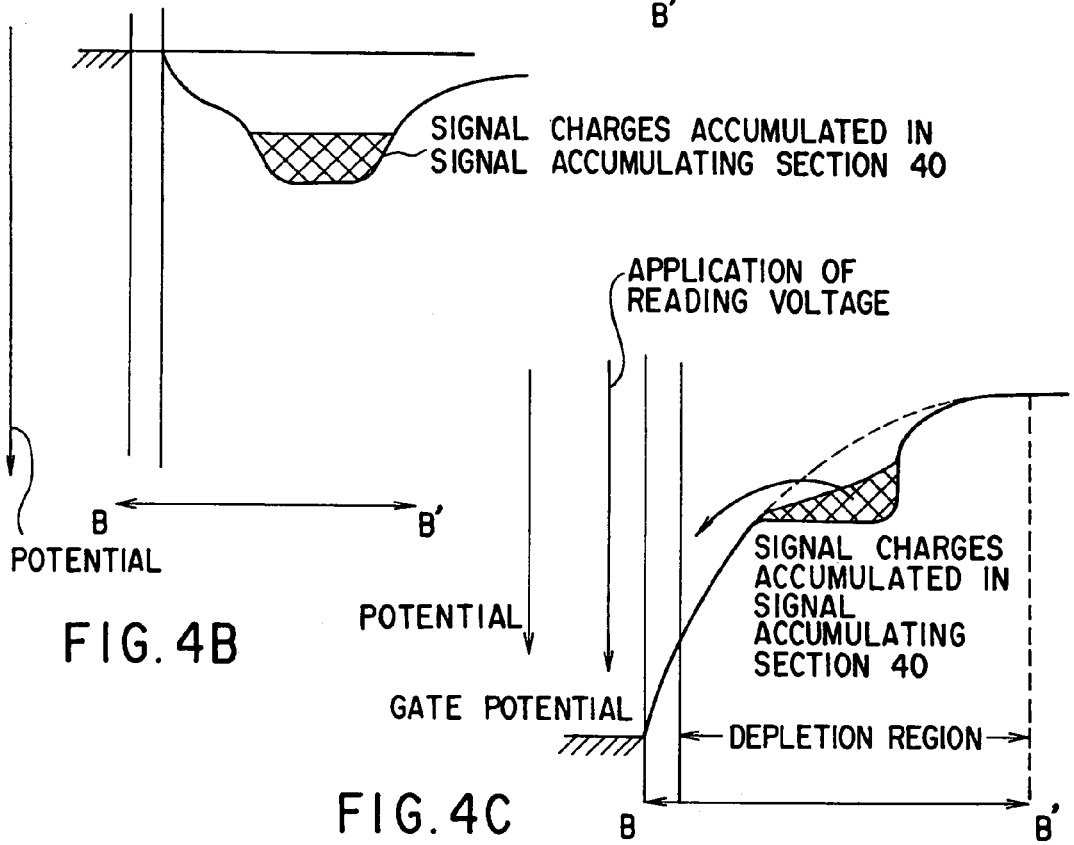
FIG.4B
FIG.4C
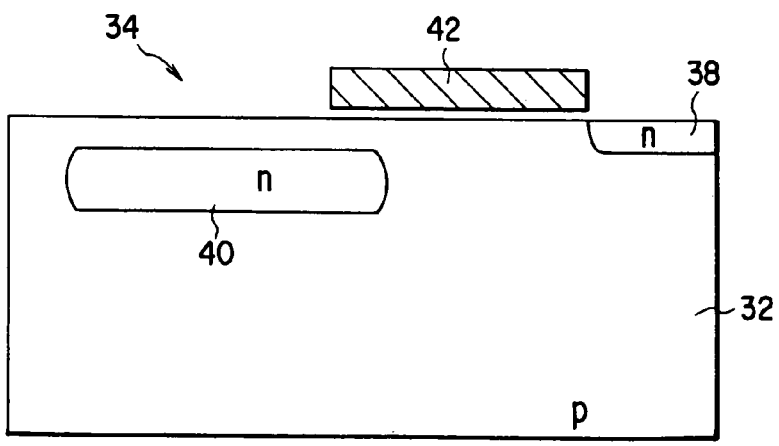
FIG.5

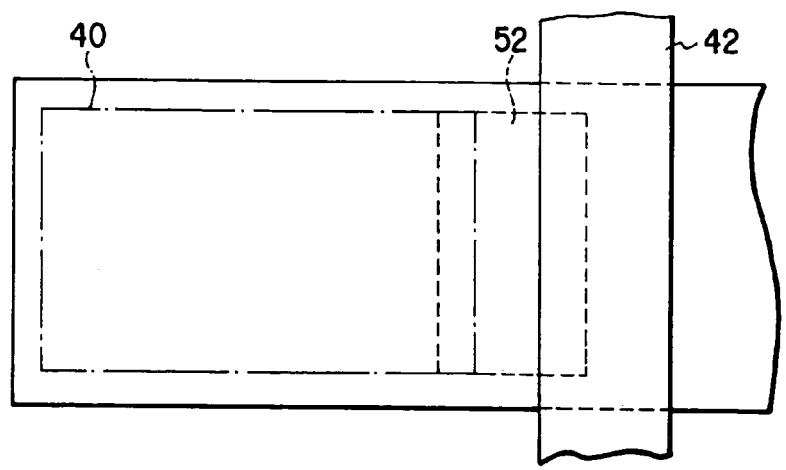
FIG. 13A
FIG. 13B
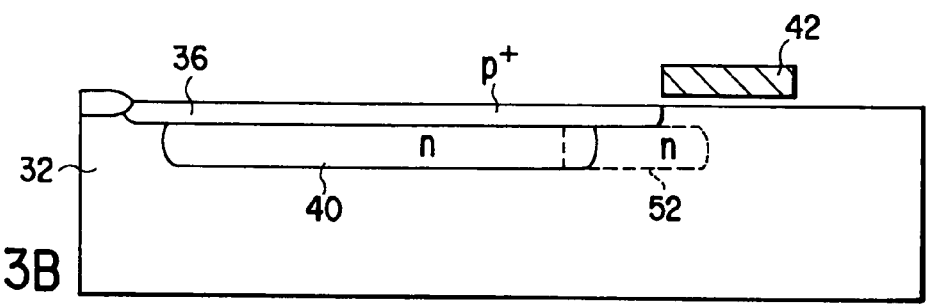
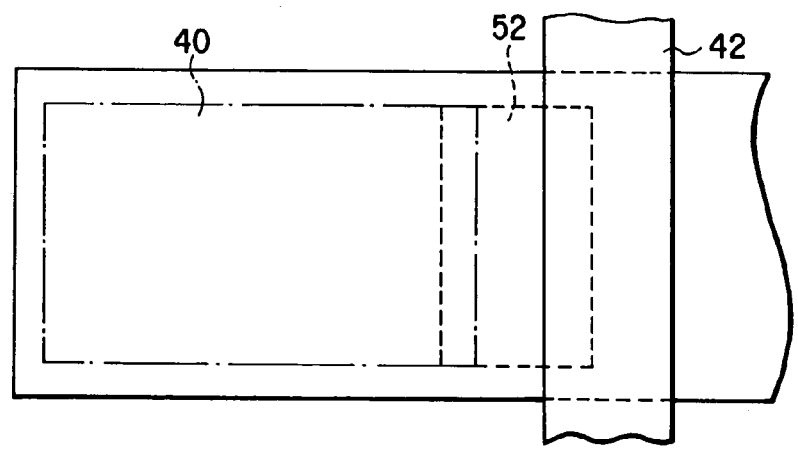
FIG. 14A
FIG. 14B
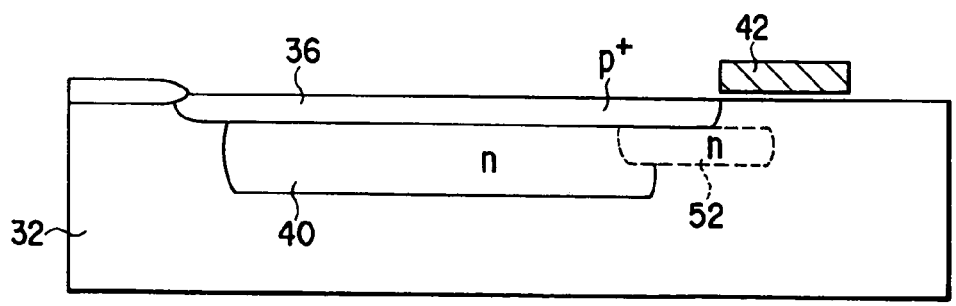

SOLID-STATE IMAGE PICKUP APPARATUS

CROSS REFERENCE TO RELATED APPLICATIONS

This is a divisional application of, and claims priority from application Ser. No. 09/272,337, filed Mar. 19, 1999 now U.S. Pat. No. 6,690,423. The present application is based upon and claims the benefit of priority under 35 U.S.C. §119 to the following Japanese Patent Applications: 10-070801, filed Mar. 19, 1998; 10-070892, filed Mar. 19, 1998; and 10-087380 filed Mar. 31, 1998. The contents of each of these applications are incorporated herein by reference.

BACKGROUND OF THE INVENTION

The present invention relates a solid-state image pickup apparatus, and more particularly to a solid-state image pickup apparatus which is capable of preventing reduction in dynamic ranges of signals, thermal noise, image-lags and the like and enabling a high-quality reproduced image to be obtained.

A MOS solid-state image pickup apparatus (a MOS image sensor) has attracted attention in recent years because of its advantages that the size can be reduce and only a single power source is required to operate the MOS solid-state image pickup apparatus. Moreover, all elements including the image pickup section or peripheral circuits can be manufactured by MOS processes so that a chip is formed as one integrated circuit.

A variety of techniques have been suggested about the amplifier-type MOS solid-state image pickup apparatus (an amplifier-type MOS image sensor) having pixels each including an amplifying function. The foregoing amplifier-type MOS sensor has been expected to enable the number of pixels to be enlarged to improve the image quality and the size of each pixel to be reduced to reduce the image size.

As compared with the CCD image sensor, the amplifier-type MOS image sensor requires only small power consumption and permits unification with other peripheral circuits which are formed by the same CMOS process as the sensor section. Therefore, an advantage can be realized in that cost reduction is permitted.

FIG. 1 is a diagram showing a part of a cross sectional structure of a unit pixel disposed two-dimensionally in an image pickup region of the solid-state image pickup apparatus called an amplifier-type MOS image sensor.

Referring to FIG. 1, a p-type (although p-type is shown in the drawing, N-type is permitted) well region 4 is formed on a p-type silicon substrate 2. A light receiving region 10 composed of a $p^+$ diffusion layer 6 which is provided on the surface of the light receiving substrate and an n-type diffusion layer 8 which serves as a signal accumulating section, a signal detecting section 12 and an amplifying transistor 18 having a drain 14 and a source 16 are formed on the surface of the well region 4.

A gate electrode 20 of a reading MOS field effect transistor (hereinafter abbreviated as "reading MOS transistor") is, on the well region 4, disposed between the light receiving region 10 and the signal detecting section 12. An electric wire 24 is connected to the signal detecting section 12 and a gate electrode 22 of the amplifying transistor 18 to establishing the connection between the signal detecting section 12 and the gate electrode 22. Moreover, a signal reading line 26 is connected to a source 16 of the amplifying transistor 18.

The operation of the image pickup element having the above-mentioned pixel structure is as follows.

Light beams made incident on the light receiving region 10 in the photoelectric conversion region during a signal accumulating period generates signal charges. The signal charges are accumulated in the signal accumulating section (the n-type diffusion layer) 8. After the signal accumulating period has been completed, the reading MOS transistor is turned on so that the signal charge is discharged from the signal accumulating section 8 to the signal detecting section 12 through the channel of the MOS transistor. In the signal detecting section 12, the signal charge is converted into a signal voltage. The charge of the signal voltage is introduced into the gate electrode 22 of the amplifying transistor through the wire 24. The signal charge is read from the signal reading line 26 connected to the source 16 of the amplifying transistor.

FIGS. 2A and 2B are diagrams showing a state in which a signal charge is read when the signal charge is discharged from the signal accumulating section 8 to the signal detecting section 12.

When the reading gate has been turned on, the potential of the MOS channel is raised. Thus, the signal charge accumulated in the signal accumulating section 8 is read through the channel of the MOS transistor as indicated with an arrow A shown in FIG. 2A.

However, the above-mentioned conventional pixel structure suffers from the following problems.

That is, when a signal charge is read, the potential of the channel of the MOS transistor is raised. Therefore, the potential of an end of the signal accumulating section adjacent to the reading gate is modulated so that the signal charge is read from the signal accumulating section. However, if a $p^+$ layer for preventing a dark current exists, the potential of the end of the signal accumulating section adjacent to the reading gate cannot easily be modulated with the gate potential because the potential of the $p^+$ layer is fixed to a reference potential. Therefore, a potential barrier for the signal charge is formed, as shown in FIG. 2B. As a result, reading of a signal indicated with the arrow A cannot completely be performed.

If reading of a signal from the signal accumulating section 8 cannot completely be performed, the reproduced image encounters problems in that the dynamic range of the element is reduced, thermal noise increases in a dark state and an image-lag is formed. Therefore, there arises a problem in that the quality of the reproduced image excessively deteriorates. Moreover, the above-mentioned problem becomes furthermore critical as the pixel size is reduced.

To meet requirement for improving the quality of a reproduced image or reducing the element size, the size of each unit pixel has been reduced from year to year. Although the size of the MOS transistor is reduced as the size of the unit pixel is reduced, the foregoing reduction in the element size usually causes reduction in the applied voltage and rise in the concentration of impurities in the well to occur in accordance with a rule of scale down.

However, if the scale down is performed, the region, the potential of which can be modulated by the MOS gate is narrowed and limited to only a shallow part adjacent to the gate. Therefore, modulation of the potential of the end of the signal accumulating section adjacent to the reading gate formed deeper than the $p^+$ layer in the surface of the substrate cannot easily be performed. As a result, the foregoing potential barrier is easily formed in the fined pixel. Therefore, the above-mentioned problems peculiar to the amplifier-type MOS sensor becomes furthermore critical.

BRIEF SUMMARY OF THE INVENTION

Accordingly, an object of the present invention is to provide a solid-state image pickup apparatus which permits signal charges to easily be read from a signal accumulating section and which is free from reduction in the dynamic range of the element, thermal noise and an image-lag even if the voltage which is applied to a reading gate is lowered owning to size reduction of the pixels of the amplification-type MOS image sensor and concentration in the well in a channel section of the reading MOS transistor is raised.

To achieve the above-mentioned object, according to a first object of the present invention, there is provided a solid-state image pickup apparatus which incorporates a semiconductor substrate having an image pickup region including unit pixels disposed in a two-dimensional configuration and signal scanning sections for reading signals from the pixels in the image pickup region, comprising:

a photoelectric conversion region having a first-conduction-type signal accumulating section formed at a position apart from the interface of the semiconductor substrate in a direction of the depth of the semiconductor substrate for a predetermined distance and arranged to accumulate signal charges obtained from photoelectric conversion; and a gate electrode of a first-conduction-type MOS field effect transistor formed adjacent to the photoelectric conversion region and arranged to discharge a signal charge from the signal accumulating section, wherein at least a part of the signal accumulating section in a direction of a channel thereof is extended to overlap the gate electrode in a direction in which signals are discharged, and modulation of the potential of the gate electrode is used to discharge signals from the signal accumulating section through the channel of the MOS field effect transistor.

According to a second object of the present invention, there is provided a solid-state image pickup apparatus incorporating a first-conduction-type well region formed on a semiconductor substrate, a photodiode section formed on the well region and having a second-conduction-type region, a first-conduction-type surface layer formed on the second-conduction-type region of the photodiode section, a second-conduction-type drain region formed in the first-conduction-type well region in the vicinity of the second-conduction-type region of the photodiode section and a gate section of a reading transistor formed above the well region at a position between the drain region and the second-conduction-type region of the photodiode, comprising:

a first-conduction-type barrier layer offset to extend from a deep portion in the second-conduction-type drain region toward the second-conduction-type region of the photodiode; and a second-conduction-type and high-concentration channel formation layer formed in the second-conduction-type region of the photodiode section at a position more adjacent to the surface layer than the position of the barrier layer toward an end of the gate.

According to a third object of the present invention, there is provided a solid-state image pickup apparatus incorporating a photodiode region, which has a shield layer for preventing surface recombination and which is formed into a surface shield structure, and a reading gate electrode for reading charges in the photodiode region, the solid-state image pickup apparatus comprising:

an impurity region formed between the reading gate electrode and the shield layer and arranged to remove a potential barrier caused from the shield layer.

According to a fourth object of the present invention, there is provided a solid-state image pickup apparatus comprising: a photodiode region, which has a shield layer for preventing surface recombination and which is formed into a surface shield structure; and a reading gate electrode for reading charges in the photodiode region, wherein the shield layer has concentration gradient from the photodiode region to the reading gate electrode.

The solid-state image pickup apparatus according to the present invention has the signal accumulating section extended to a position directly below the reading gate. Therefore, the potential of the signal accumulating section can easily be modulated by the reading gate. As a result, formation of a potential barrier can be prevented and, therefore, signals can satisfactorily be read even in a fined pixel. Thus, a high-quality reproduced image can be obtained without reduction in the dynamic ranges of signals, thermal noise and an image-lag.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A and 2B show a state in which signal charges are read when the signal charges are discharged from a signal accumulating section 8 to a signal detecting section 12, in which FIG. 2A is a diagram showing a passage through which signal charges are read and FIG. 2B is a diagram schematically showing potentials of a signal charge;

FIGS. 4A to 4C are diagrams showing an operation for reading unit pixel according to a first embodiment, in which FIG. 4A is an enlarged view showing the cross sectional structure of an end adjacent to a reading gate electrode, FIG. 4B is a diagram showing distribution of potentials in a region between arrows B and B' shown in FIG. 4A when the gate has been turned off and FIG. 4C is a diagram showing a state of the region between arrows B and B' shown in FIG. 4A when the gate has been turned on;

FIG. 5 is a cross sectional view showing the structure of an essential part of a unit pixel according to a second embodiment of the present invention;

FIGS. 13A and 13B are diagrams showing the structure of an essential part of a unit pixel according to a seventh embodiment of the present invention, in which FIG. 13A is a plan view and FIG. 13B is a cross sectional view;

FIGS. 14A and 14B are diagrams showing an essential part of a unit pixel according to an eighth embodiment of the present invention, in which FIG. 14A is a plan view and FIG. 14B is a cross sectional view;

FIGS. 27A and 27B are diagrams showing an essential part of a CMOS image sensor according to a nineteenth embodiment of the present invention, in which FIG. 27A is a schematic cross sectional view showing a structure of a cell section and FIG. 27B is a diagram schematically showing its potential;

FIGS. 36A and 36B are diagrams showing the structure of an essential part of a twenty-fifth embodiment of the solid-state image pickup apparatus according to the present invention, in which FIG. 36A is a cross sectional view showing a cell section of the solid-state image pickup apparatus and FIG. 36B is a diagram showing potentials corresponding to a state in which the gate voltage is applied and a state in which the gate voltage is not applied;

FIGS. 37A and 37B are diagrams showing the structure of an essential part of a twenty-sixth embodiment of the solid-state image pickup apparatus according to the present invention, in which FIG. 37A is a cross sectional view showing a cell section of the solid-state image pickup apparatus and FIG. 37B is a diagram showing potentials corresponding to a state in which the gate voltage is applied and a state in which the gate voltage is not applied; and FIGS. 38A and 38B are diagrams showing the structure of an essential part of a twenty-seventh embodiment of the solid-state image pickup apparatus according to the present invention, in which FIG. 38A is a cross sectional view showing a cell section of the solid-state image pickup apparatus and FIG. 38B is a diagram showing potentials corresponding to a state in which the gate voltage is applied and a state in which the gate voltage is not applied.

DETAILED DESCRIPTION OF THE INVENTION

Figure 1:
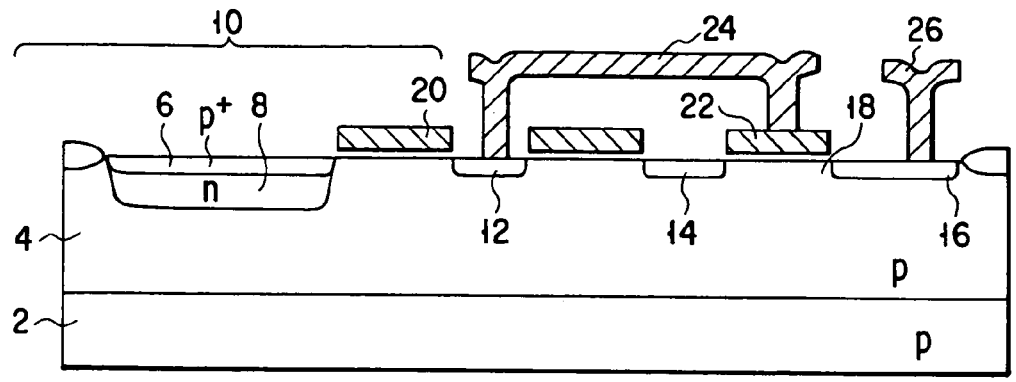
FIG. 1 is a diagram showing the cross sectional structure of a part of a unit pixel which is two-dimensionally disposed in an image pickup region of a conventional amplification-type MOS sensor.
Figure 2A:
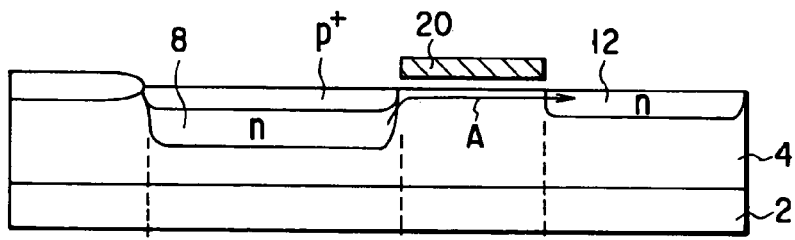
Figure 2B:
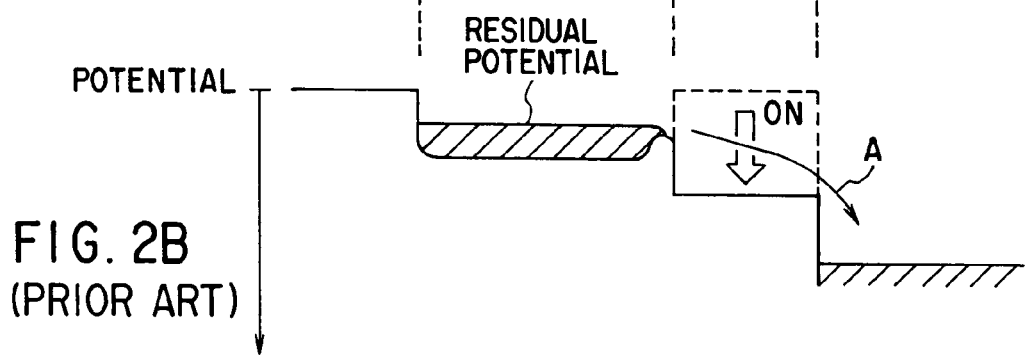

Referring to the drawings, embodiments of the present invention will now be described.

Figure 3:
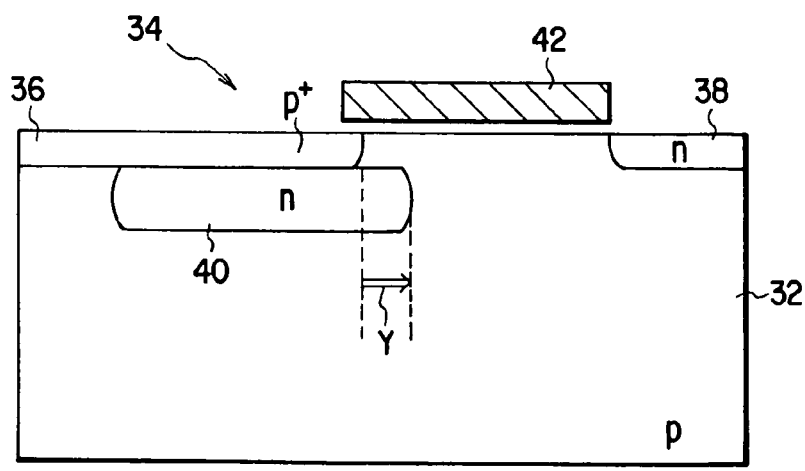
FIG. 3 is a cross sectional view showing the structure of an essential part of a unit pixel of a solid-state image pickup apparatus according to a first embodiment of the present invention.

FIG. 3 is a cross sectional view showing the structure of an essential part of a unit pixel of a solid-state image pickup apparatus according to a first embodiment of the present invention.

As shown in FIG. 3, a $p^+$ diffusion layer 36 for constituting a photoelectric conversion region 34 and a drain 38 of a reading MOS type field effect transistor (hereinafter abbreviated as a "MOS transistor") disposed apart from the p$^+$ diffusion layer 36 for a predetermined distance are formed in the surface of a p-type silicon substrate 32. A part of a signal accumulating section 40 constituted by an n-type diffusion layer is formed below the p$^+$ diffusion layer 36 at a position adjacent to the drain 38. A gate electrode 42 of the MOS field effect transistor is formed on the surface of the p-type silicon substrate 32 at a position between the p$^+$ diffusion layer 36 and the drain 38.

The p$^+$ diffusion layer 36 is formed to prevent a dark electric current which is produced in the photoelectric conversion region 34 on the surface of the substrate. The position of the end of the signal accumulating section 40 adjacent to the gate electrode 42 of the MOS transistor extends to a position below the gate electrode 42 of the p$^+$ diffusion layer formed in the surface region of the p-type silicon substrate 32 for a distance indicated with an arrow Y shown in the drawing as compared with the end adjacent to the reading gate electrode 42 of the p$^+$ diffusion layer.

FIGS. 4A to 4C show an operation for reading a unit pixel according to the first embodiment. FIG. 4A is an enlarged view of a cross sectional structure of the end adjacent to the reading gate electrode. Referring to FIG. 4A, a reading potential has been applied to turn the reading gate electrode 42 on. Thus, a depletion layer 44 is formed below the MOS gate. The depletion layer 44 reaches a part between a part of the signal accumulating section 40 extending to the portion below the gate electrode. Note that an arrow C indicates a depletion region.

FIGS. 4B and 4C show distribution of potentials in a region indicated with arrows B–B' shown in FIG. 4A. FIG. 4B shows the potential distribution realized when the gate has been turned off, while FIG. 4 shows the same realized when the gate has been turned on.

Referring to FIG. 4B, signal charges have been accumulated in the signal accumulating section 40 formed in a relative inner portion of the substrate when the reading gate has been turned off.

When a reading potential is being applied to the gate as shown in FIG. 4C, the application of the reading potential to the gate electrode 42 causes a depletion layer to be formed in the silicon substrate. The depletion layer reaches the signal accumulating section 40 extending to a position below the gate electrode 42. As a result, the accumulated signal charges starts flowing to the surface of the substrate having a higher potential. Therefore, reading is performed. The signal charge which has reached the surface of the substrate starts flowing to the drain 38.

As described above, this embodiment is different from the conventional pixel structure in that no p$^+$ region which causes a potential barrier to be produced does not exist between the gate electrode and the signal accumulating section. Therefore, no potential barrier is formed and, therefore, all of signal charges can be read.

FIG. 5 is a cross sectional view showing the structure of an essential part of a unit pixel according to a second embodiment of the present invention.

In the following embodiments, the same elements as those according to the above-mentioned embodiment are given the same reference numerals and the same elements are omitted from description.

Referring to FIG. 5, a photoelectric conversion region 34 is formed by removing the p$^+$ diffusion layer 36 formed in the surface of the p-type silicon substrate 32 of the unit pixel structure according to the first embodiment and shown in FIG. 3.

Also the above-mentioned structure enables an effect similar to that in the first embodiment to be obtained.

Figure 6:
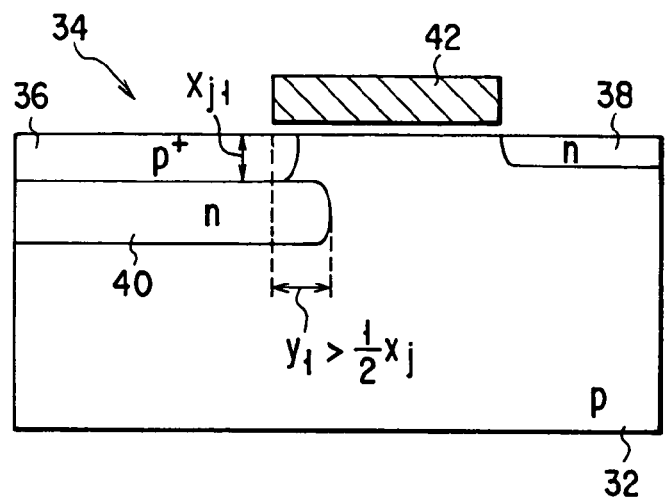
FIG. 6 is a cross sectional view showing the structure of an essential part of a unit pixel according to a third embodiment of the present invention.

FIG. 6 is a cross sectional view showing an essential part of a unit pixel according to a third embodiment of the present invention.

The basic structure of the third embodiment is the same as that of the first embodiment shown in FIG. 3. In this embodiment, the relationship between the p$^+$ diffusion layer 36 and the signal accumulating section 40 is specified.

Referring to FIG. 6, symbol $x_j$ indicates a depth of junction of the p$^+$ diffusion layer 36 and $y_1$ indicates the length of a part of the signal accumulating section 40 extending to a position below the gate electrode 42. In this embodiment, the length $y_1$ of the extension is longer than ½ of the junction depth $x_j$ of the p$^+$ diffusion layer 36.

The reason why the length of the extension is specified as described above will now be described.

The p$^+$ diffusion layer 36 formed in the surface of the substrate is formed in a self-alignment manner with respect to the gate electrode 42 by implanting, for example, boron ions. However, a heat process performed after the ion implanting process causes boron implanted into the substrate to be diffused in the substrate. As a result, boron is introduced into positions below the gate electrode 42. The distance of introduction in the direction of the interface of the substrate is in proportion to the final junction depth $x_{j1}$ of the p$^+$ diffusion layer 36. Therefore, the p$^+$ diffusion layer 36 extends to the lower position of the gate electrode 42 as $x_{j1}$ is enlarged.

If the length $y_1$ of the extension of the end of the signal accumulating section 40 toward the gate electrode 42 is longer than (½)·$x_{j1}$, the overlap between the gate electrode 42 and the signal accumulating section 40 can sufficiently be enlarged to permit reading.

Figure 7:
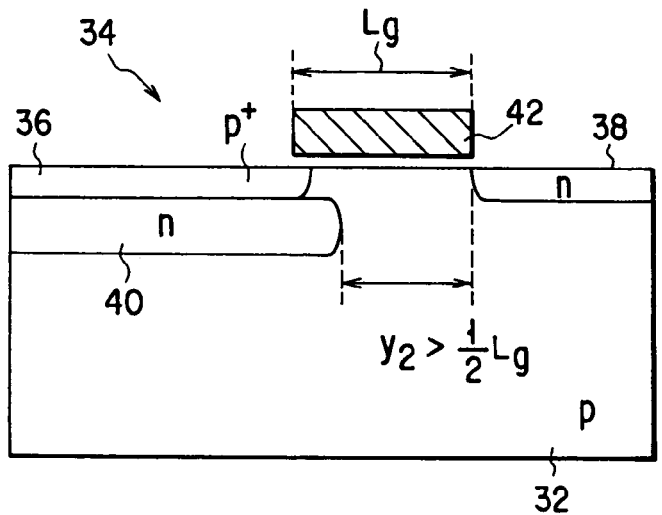
FIG. 7 is a cross sectional view showing the structure of an essential part of a unit pixel according to a fourth embodiment of the present invention.

FIG. 7 is a cross sectional view showing the structure of an essential part of a unit pixel according to a fourth embodiment of the present invention.

Referring to FIG. 7, symbol $y_2$ represents a distance from an end of the signal accumulating section 40 to a signal detecting section which is a drain 38 of the MOS transistor. Symbol Lg indicates the length of the reading gate (the gate electrode 42). In this embodiment, the distance ½ between the signal accumulating section 40 and the drain 38 is longer than half the length Lg of the reading gate.

The reason why the distance $y_2$ is specified as described above will now be described.

When the signal accumulating section 40 is extended to the position below the gate electrode 42, reading can easily be performed. However, the signal accumulating section which is the source of the reading MOS transistor and the signal detecting section which is the drain 38 undesirably approach each other. As a result, so-called punch through of the MOS transistor occurs. If the punch through occurs, the gate cannot switch on/off the transistor. In this case, a state in which the MOS transistor is always switched on is realized. As a result, accumulation of signals cannot be performed.

Therefore, the fourth embodiment is arranged such that the distance $y_2$ from the end of the signal accumulating section 40 to the end of the signal detecting section adjacent to the end of the gate is longer than (½)·Lg on an assumption that the length of the gate is Lg. Since the distance $y_2$ is determined as described above, occurrence of the punch through can be prevented. As a result, the transistor can be turned on/off by the gate.

Also the pixel according to the first embodiment and shown in FIG. 3 may be provided with a barrier layer in order to prevent problems, such as the punch through.

Figure 8A:
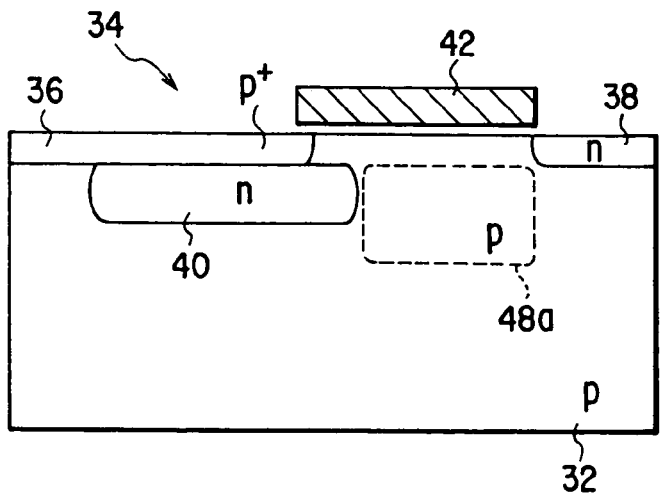
FIG. 8A is a cross sectional view showing the structure of an essential part of a unit pixel according to a first modification of the first embodiment.
Figure 8B:
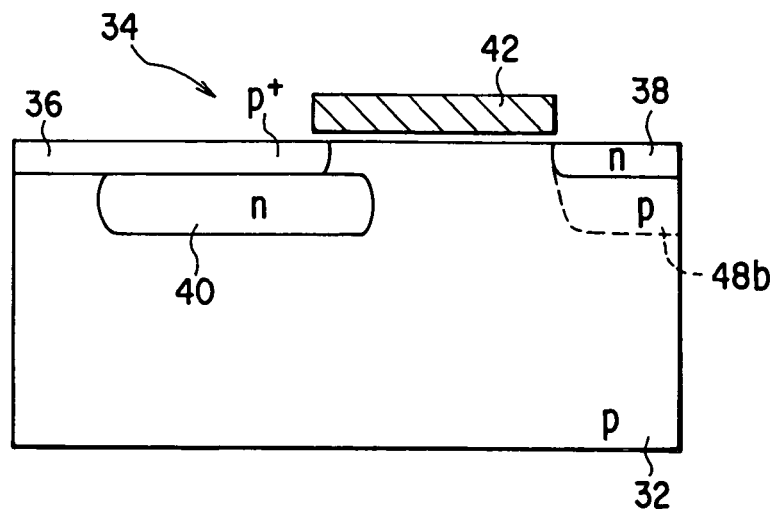
FIG. 8B is a cross sectional view showing the structure of an essential part of a unit pixel according to a second modification of the first embodiment.

FIGS. 8A and 8B are diagrams showing first and second modifications of the first embodiment.

The first modification shown in FIG. 8A has a structure incorporating a (p-type and high concentration) barrier layer 48a which is formed below the gate electrode 42 and which has the same type as that of the p-type silicon substrate and a concentration higher than that in the p-type silicon substrate 32. As a result, depletion layers extending from the signal accumulating section 40 which is the source of the MOS transistor and the drain 38 can be prevented.

A (p-type and high concentration) barrier layer 48b as shown in FIG. 8B may be formed. The barrier layer 48b is formed adjacent to the lower portion of the drain 38 of the MOS transistor in place of the position below the gate electrode 42. The barrier layer 48b has the same conduction type as that of the p-type silicon substrate 32 and a concentration higher than that in the p-type silicon substrate 32. In the foregoing case, depletion layers extending from the signal accumulating section 40 which is the source of the MOS transistor and the drain 38 can be prevented.

Note that the barrier layers 48a and 48b may be applied to the second to fourth embodiments. Although the substrate 32 has been described as the p-type substrate, a p-type well region may be formed on an N-type substrate to constitute the same structure as that shown in FIGS. 3 to 8.

Figure 9:
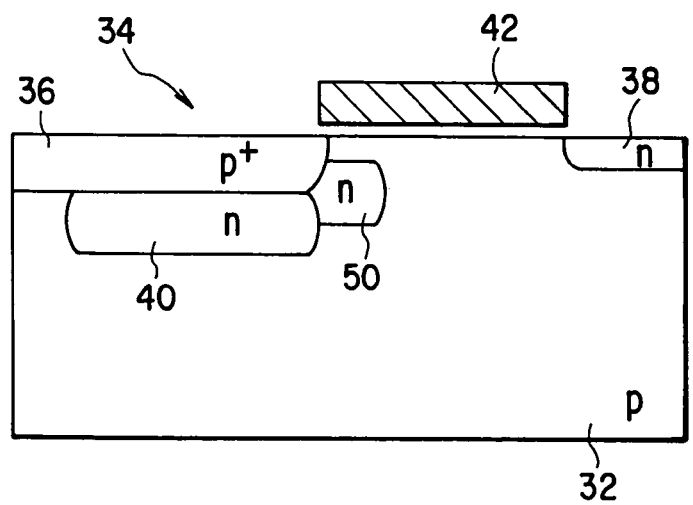
FIG. 9 is a cross sectional view showing the structure of an essential part of a unit pixel according to a fifth embodiment of the present invention.

FIG. 9 is a cross sectional view showing the structure of an essential part of a unit pixel according to a fifth embodiment of the present invention.

Referring to FIG. 9, a part formed to extend from the signal accumulating section 40 to the position below the gate electrode 42, that is, the depth of the signal accumulating section 50 from the surface of the substrate is shallower than the depth of the signal accumulating section 40 from the surface of the substrate. As a result, the signal accumulating section 50 extending toward the gate electrode 42 is formed more adjacent to the surface of the substrate so that potential modulation is more easily performed by the reading gate. Therefore, signals can furthermore easily be read.

Figure 10:
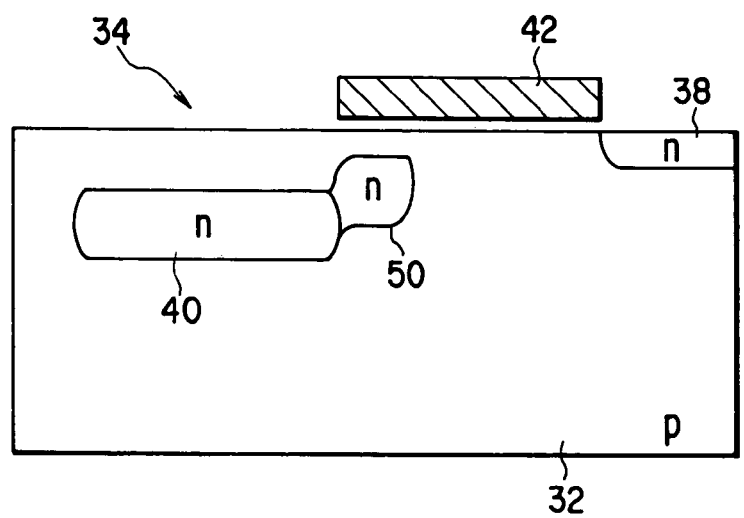
FIG. 10 is a cross sectional view showing an essential part of a unit pixel according to a sixth embodiment of the present invention.

FIG. 10 is a sectional view showing the structure of an essential part of a unit pixel according to a sixth embodiment of the present invention.

The sixth embodiment has a structure that the p+ diffusion layer 36 according to the fifth embodiment shown in FIG. 9 is omitted to form the unit pixel. The other structures are the same as those according to the fifth embodiment.

Figure 11A:
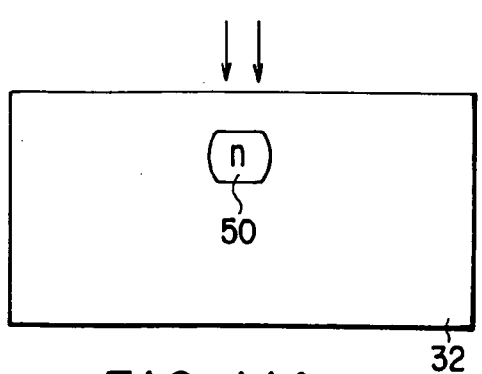
FIGS. 11A to 11C are cross sectional views showing essential parts a process for manufacturing a unit pixel having the structure shown in FIG. 9.
Figure 11B:
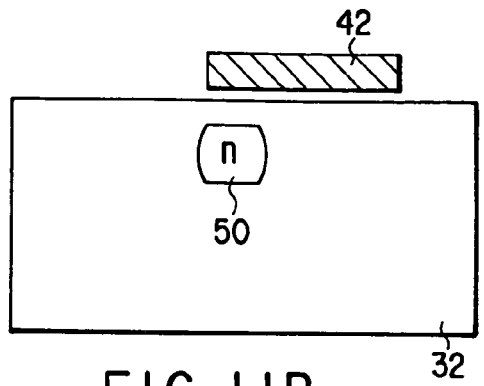
Figure 11C:
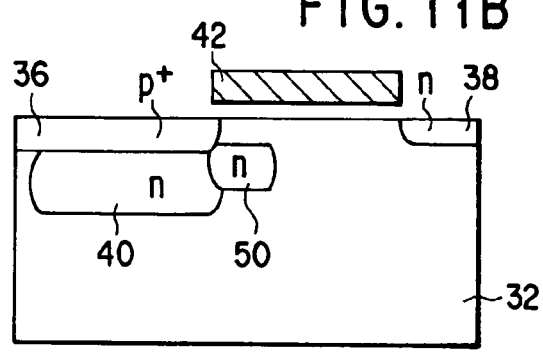

FIGS. 11A to 11C are sectional views showing essential parts of a process for manufacturing a unit pixel having the structure shown in FIG. 9.

Referring to FIG. 11A, the signal accumulating section 50 which is a part of the signal accumulating section is formed at a predetermined depth from the surface of the p-type silicon substrate 32 by ion implantation or the like before forming the gate electrode 42 is formed. Then, a part of the reading gate (the gate electrode 42) is formed above the signal accumulating section 50 at a position on the surface of the p-type silicon substrate 32.

Then, as shown in FIG. 1C, the p+ diffusion layer 36 and the drain 38 are formed at predetermined positions in the surface of the p-type silicon substrate 32. Then, the signal accumulating section 40 is formed below the p+ diffusion layer 36. As a result, a pixel having a structure as shown in FIG. 9 can be formed.

Figure 12A:
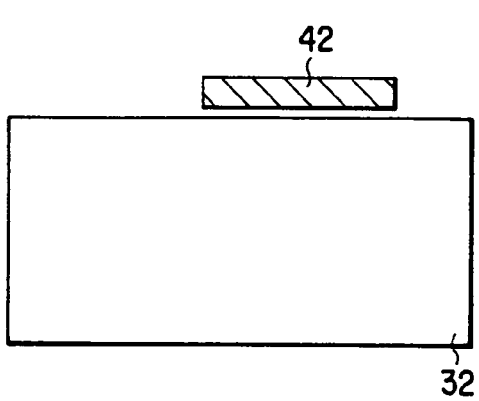
FIGS. 12A to 12C are cross sectional views showing essential parts of a process for manufacturing a unit pixel having the structure shown in FIG. 9.
Figure 12B:
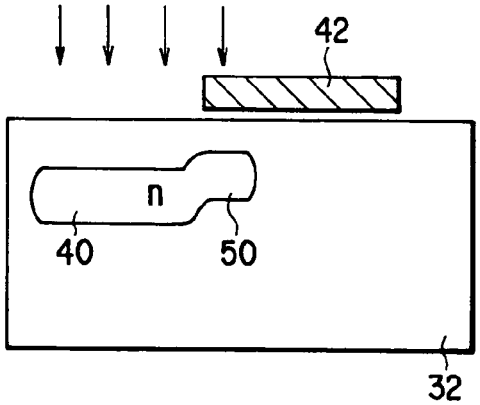
Figure 12C:
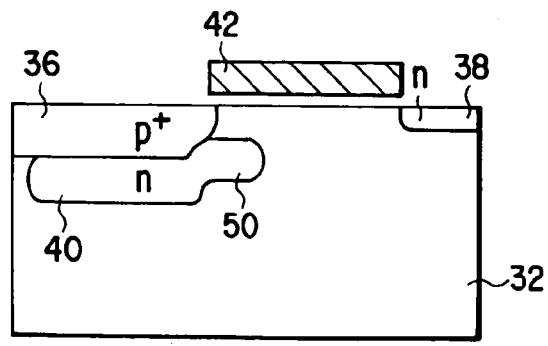

FIGS. 12A to 12C are cross sectional views showing another process for manufacturing a unit pixel having the structure shown in FIG. 9.

Referring to FIG. 12A, the gate electrode 42 is formed on the surface of the p-type silicon substrate 32. Then, as shown in FIG. 12B, the signal accumulating sections 40 and 50 are formed at predetermined positions by ion implantation. At this time, a part of ions are implanted through the gate electrode 42. Therefore, a relatively shallow diffusion layer (the signal accumulating section) 50 is formed by ion implantation performed through the gate electrode 42. On the other hand, a relatively deep diffusion layer (the signal accumulating section) 40 is formed in a part into which ions which have not been allowed to pass through the gate electrode 42. The signal accumulating sections 40 and 50 are formed simultaneously.

As shown in FIG. 12C, the p+ diffusion layer 36 and the drain 38 are formed at predetermined positions in the surface area of the p-type silicon substrate 32. As a result, a pixel having a structure as shown in FIG. 9 can be formed.

FIGS. 13A and 13B are diagrams showing the structure of a unit pixel according to a seventh embodiment of the present invention. FIG. 13A is a plan view, and FIG. 13B is a cross sectional view.

Referring to FIGS. 13A and 13B, an n-type diffusion layer 52, a part of which extends to a position below the gate electrode 42 and which is a second region of the signal accumulating section, is formed in a part extending from the signal accumulating section 40 to a position below the p+ diffusion layer 36 formed in the surface of the p-type silicon substrate 32. The signal accumulating section 40 which is a first region of the signal accumulating section is formed apart from the reading MOS gate.

The n-type diffusion layer 52 which is the second signal accumulating section has an end which is extended to a position directly below the reading gate. Another end of the n-type diffusion layer 52 is formed to overlap the signal accumulating section 40.

FIGS. 14A and 14B are diagrams showing the structure of a unit pixel according to an eighth embodiment of the present invention. FIG. 14A is a plan view, and FIG. 14B is a cross sectional view.

Referring to FIGS. 14A and 14B, the p+ diffusion layer 36 is formed in the surface of the p-type silicon substrate 32. A signal accumulating section 40, which is the first region, is formed below the p+ diffusion layer 36 at a position apart from the reading MOS gate. A part of the n-type diffusion layer 52, which is the second region of the signal accumulating section, is extended to a position below the reading gate (the gate electrode) 42 at the lower surface of the end of p+ diffusion layer 36. Note that a part of the n-type diffusion layer 52 overlaps the signal accumulating section 40.

The eighth embodiment has a structure that the depth of the junction of the signal accumulating section 40 which is the first region is larger than the depth of the junction of the n-type diffusion layer 52 which is the second region.

Figure 15:
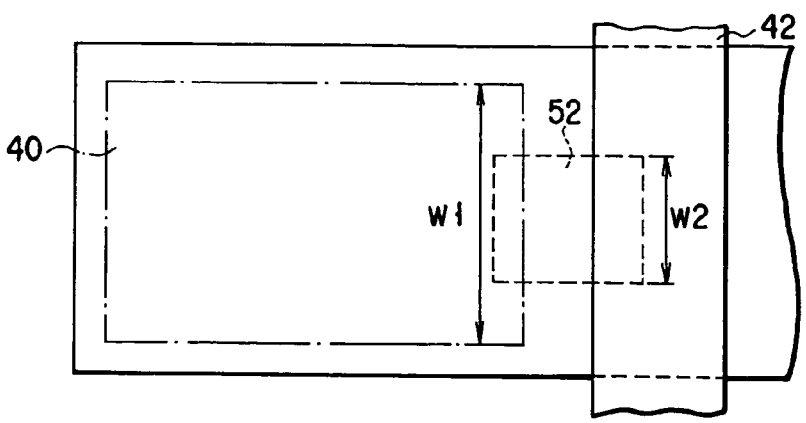
FIG. 15 is a plan view showing the structure of an essential part of a unit pixel according to a ninth embodiment of the present invention.

FIG. 15 is a plan view showing the structure of an essential part of a unit pixel according to a ninth embodiment of the present invention.

Referring to FIG. 15, the width W1 of the signal accumulating section 40 which is the first region is larger than the width W2 of the n-type diffusion layer 52 which is the second region (W1>W2). The structures except for the widths W1 and W2 may be the structures according to any one of the foregoing embodiments.

Figure 16:
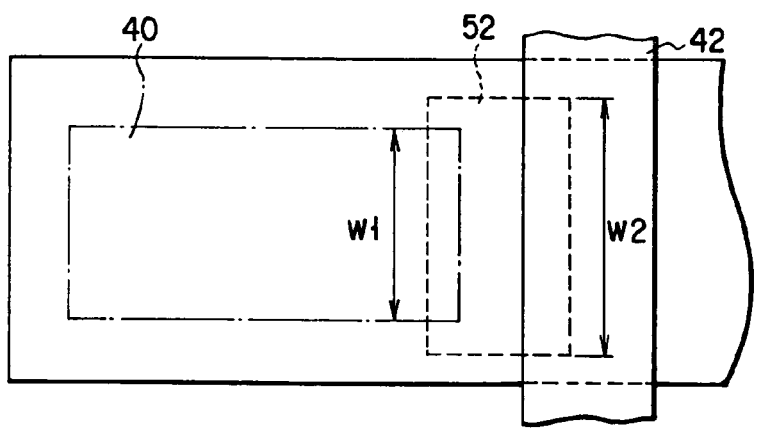
FIG. 16 is a plan view showing the structure of an essential part of a unit pixel according to a tenth embodiment of the present invention.

FIG. 16 is a plan view showing the structure of an essential part of a unit pixel according to the tenth embodiment of the present invention.

Referring to FIG. 16, the width W1 of the signal accumulating section 40 which is the first region is smaller than the width W2 of the n-type diffusion layer 52 which is the second region (W1<W2). The structures except for the widths W1 and W2 may be the structures according to any one of the foregoing embodiments.

Figure 17:
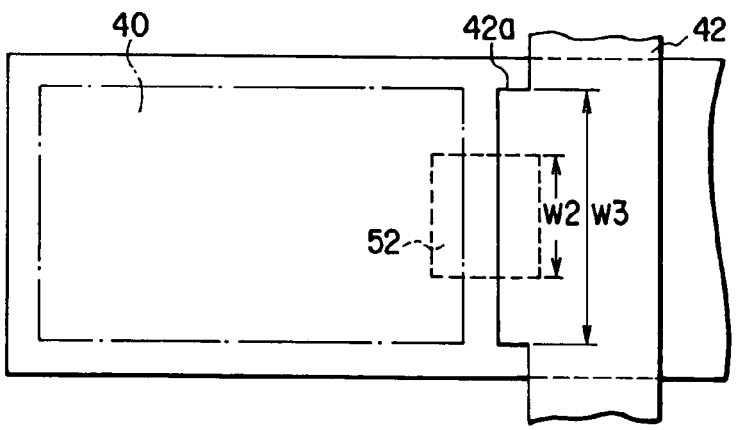
FIG. 17 is a plan view showing the structure of an essential part of a unit pixel according to an eleventh embodiment of the present invention.

FIG. 17 is a plan view showing the structure of an essential part of a unit pixel according to an eleventh embodiment of the present invention.

Referring to FIG. 17, the gate electrode 42, which is a reading MOS gate, has a gate electrode 42a extending in a direction in which signals are read. The width W2 of a section of the n-type diffusion layer 52 overlapping the reading MOS gate is smaller than the width W3 of the elongated gate electrode 42a (W2<W3), the n-type diffusion layer 52 being the second region of the signal accumulating section. Moreover, the second region of the signal accumulating section overlaps the elongated portion of the reading MOS gate.

The width W1 of the signal accumulating section 40 which is the first region may be smaller or larger than the width W2 of the n-type diffusion layer 52 which is the second region.

Figure 18:
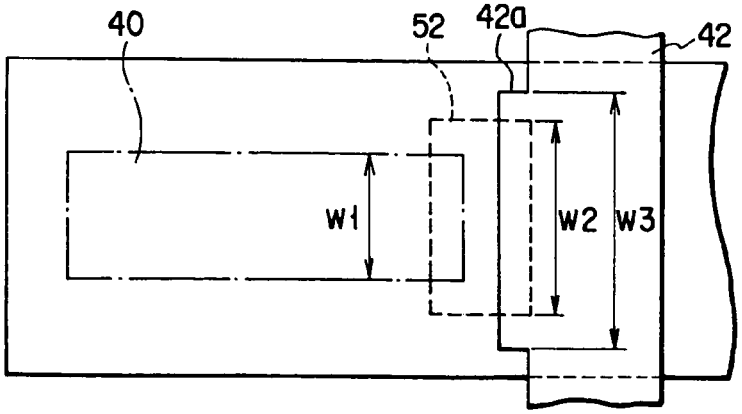
FIG. 18 is a diagram showing the relationship between width W1 of a signal accumulating section 40 in a first region and width W2 of an n-type diffusion layer 52 in a second region.

FIG. 18 is a diagram showing the relationship between the width W1 of the signal accumulating section 40, which is the first region, and the width W2 of the n-type diffusion layer 52 which is the second region, in which an example in the case of W1>W2 is illustrated.

In each of the seventh to eleventh embodiments, the signal accumulating section 40 which is the first region may be formed in a self-alignment manner with respect to the MOS gate by ion implantation or the like after the reading MOS gate (the gate electrode 42) has been formed. In the foregoing case the relationship between the signal accumulating section 40 which is the first region and the n-type diffusion layer 52 which is the second region of the signal accumulating section is the same as that according to the seventh to eleventh embodiments shown in FIGS. 13 to 18.

Figure 19:
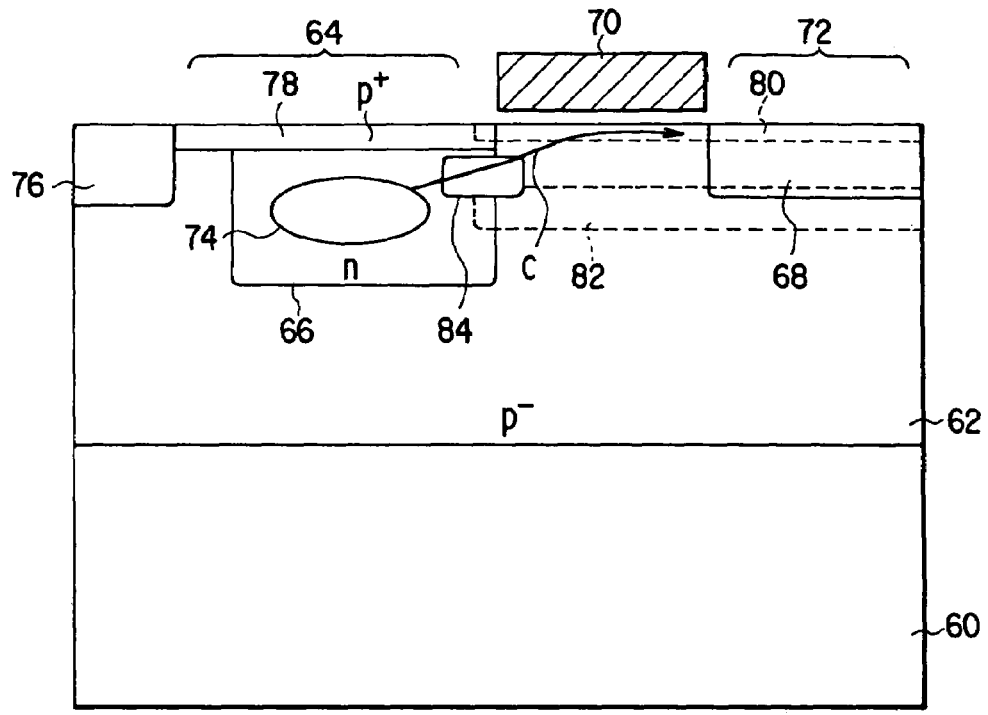
FIG. 19 is a cross sectional view showing an element according to a twelfth embodiment of the present invention.

FIG. 19 is a cross sectional view of an element according to a twelfth embodiment of the present invention.

Referring to FIG. 19, for example, p-type impurities are diffused on a silicon semiconductor substrate 60 so that a first-conduction-type well region 62 is formed. The concentration of impurities in the well region 62 is low concentration of about 1E15 (where 1E15 is $10^{15}$). A signal accumulating region 66 for forming a photodiode 64 is formed in a part of the inside of the well region 62 by implanting second-conduction-type impurities.

A detecting node section 68 is, by second-conduction-type impurities, formed in the well region 62 at a position apart from a signal accumulating region 66 for a predetermined distance, the signal accumulating region 66 being a region for forming the photodiode 64. A gate electrode 70 is formed on the semiconductor substrate 60 at a position between the detecting node section 68 and the signal accumulating region 66. The gate electrode 70 is formed across the detecting node section 68 and the signal accumulating region 66. Therefore, a MOS-type transistor is formed in which the detecting node section 68 serves as the drain region 72 and the signal accumulating region 66 forming the photodiode 64 serves as the source region.

As a result, signal charges 74 generated in the signal accumulating region 66 of the photodiode 64 can be introduced into the detecting node section 68 adjacent to the drain region 72 by controlling the voltage of the gate electrode 70. When a structure is employed in which the gate electrode of, for example, an amplification-type MOS transistor is connected to the detecting node section 68, charges of the photodiode 64 can be applied by controlling the gate electrode 70.

Therefore, the detecting node section 68 serves as a detecting node of the photodiode 64 with respect to the amplification-type MOS transistor. Therefore, the above-mentioned region forming the drain region 72 is called the detecting node. Similarly, the gate electrode 70 is a transfer gate for signals generated in the photodiode 64.

A channel stop region 76 for isolating the elements is formed on the semiconductor substrate 60 to surround the photodiode 64 and the reading transistor and the like. A surface shield region 78 for protecting the surface is formed on the signal accumulating region 66 in a region of the semiconductor substrate 60 in which the photodiode 64 is formed. Moreover, a layer having a channel implant 80 formed therein to set a threshold value of the channel implant 80 is formed below the gate electrode 70 and on the detecting node section 68.

In the foregoing case, the element isolation region 76 serves as a channel stop (a first-conduction-type and high concentration layer). The element isolation region may be isolated in a LOCOS (Local Oxidation of Silicon) region which is a thick oxide film. In the drawing, the channel stop region 76 serves as the channel stop.

The concentration of impurities in the signal accumulating region 66 in the photodiode 64 is an intermediate concentration between the concentration of impurities in the well region 62 and the concentration of impurities in the surface shield region 78. Since electron charges generated to correspond to the quantity of light received by the photodiode must be accumulated in the signal accumulating region 66 of the photodiode 64, the positive potential must be set to the signal accumulating region 66.

In the foregoing structure, the depletion layer inevitably extends to the surface (the upper surface) of the signal accumulating region 66. If the depletion layer reaches the surface (the upper surface) of the signal accumulating region 66, leak currents increase and inconsistencies occurring in a dark state increase. Therefore, design must be performed such that impurities in the surface shield region 78 formed on the surface (the upper surface) of the signal accumulating region 66 are contained at the highest concentration.

In the foregoing surface shield structure, the signal accumulating region 66 of the photodiode 64 is completely depleted. Therefore, the signal charges 74 generated in the signal accumulating region 66 of the photodiode 64 owning to photoelectric conversion taken place to correspond to the quantity of received light are accumulated in the semiconductor substrate 60 without any leakage.

However, the high-concentration surface shield region 78 inevitably extends to a position below the gate electrode 70 owning to a heat process which is performed after ion implantation in the process for manufacturing the semiconductor. If the foregoing state is realized, the potential below the gate electrode 70 cannot, however, be raised even when the gate electrode 70 has been turned on owning to the high-concentration p region. Therefore, the signal charges 74 in the photodiode 64 cannot be read.

If the channel length L of the gate electrode 70 is shortened owning to the low-concentration well region 62, the depletion layers undesirably extend from the signal accumulating region 66 of the photodiode 64 which is the source region and the detecting node section 68 which is the drain region. As a result, the punch through occurs.

If the punch through occurs in the gate electrode 70 of the transfer transistor, the transistor cannot be turned on/off by the gate, that is, the MOS transistor is always turned on. As a result, accumulation of signals cannot be performed.

Therefore, the unit pixel of the solid-state image pickup apparatus according to the twelfth embodiment has a structure that a first-conduction-type barrier layer 82, the concentration of which is higher than that in the first-conduction-type well region 62, is formed in the semiconductor substrate 60 below the gate electrode 70. Moreover, a second-conduction-type through channel layer 80 is formed adjacent to the signal accumulating region 66 of the photodiode 64 and the signal accumulating region 66 at a position below the gate electrode 70.

To prevent the problems, such as the channel-length modulation effect (drain modulation effect) and the punch through, this embodiment has the structure incorporating the (p-type and high concentration) barrier layer 82 which is formed below the gate electrode 70. The barrier layer 82 has the same type as that of the well layer 62 and a higher concentration than that of the well layer 62. Moreover, the barrier layer 82 is formed across both of the signal accumulating region 66 of the photodiode 64 and the detecting node section 68. As a result, the depletion layers extending from both of the signal accumulating region 66, which forms the photodiode 64, and the detecting node section 68 which is adjacent to the drain region of the transistor can be prevented the problem.

There is the possibility that the signal charges in the signal accumulating region 66 of the photodiode 64 cannot be read owning to an influence of the high-concentration barrier layer 82. To prevent this, a channel formation layer 84 is formed above the barrier layer 82. The channel formation layer 84 formed above the barrier layer 82 has a part extending from the signal accumulating region 66 of the photodiode 64 toward the position below the gate electrode 70.

The channel formation layer 84 is formed in only a small area in a part of the signal accumulating region 66 of the photodiode 64 adjacent to the gate electrode 70 and in a part below the gate electrode 70.

As a result of the above-mentioned structure, the channel formation layer 84 serves as a part of a passage through which signals are read in a direction indicated with an arrow C shown in the drawing. Thus, the passage for reading signals can be secured.

A thirteenth embodiment of the present invention will now be described.

Figure 20:
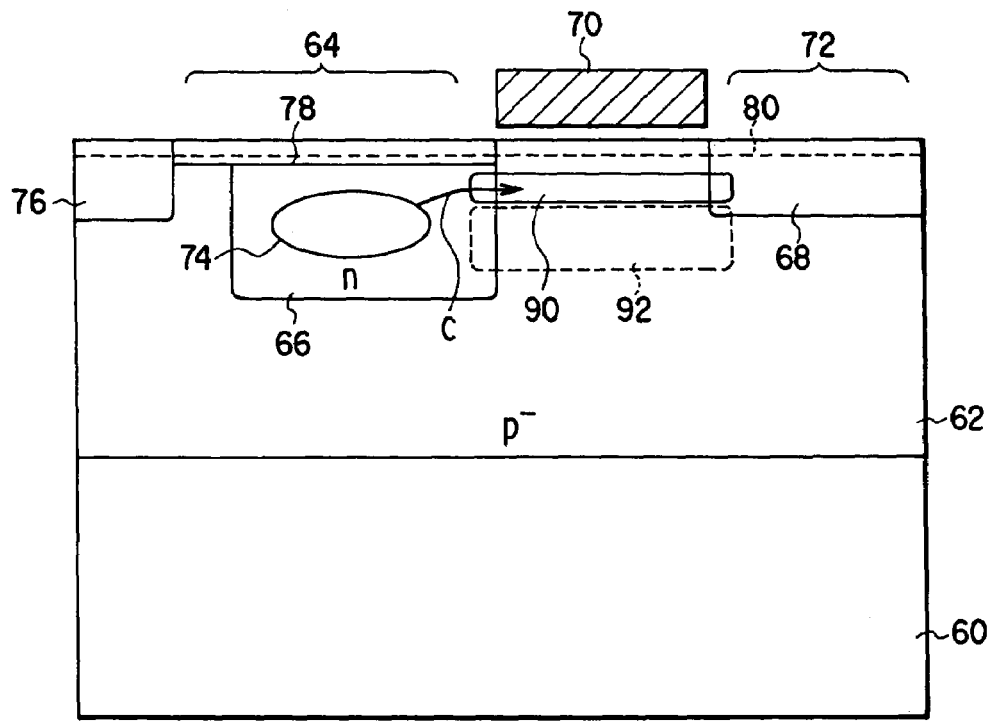
FIG. 20 is a cross sectional view showing an element according to a thirteenth embodiment of the present invention.

FIG. 20 is a cross sectional view showing the structure of an element according to the thirteenth embodiment of the present invention.

The basic structure of the thirteenth embodiment is similar to the structure according to the twelfth embodiment. That is, the channel formation layer 84 is omitted from the structure according to the twelfth embodiment. As an alternative to the channel formation layer 84, a channel-formation layer 90 is, on the barrier layer 92, formed below the gate electrode 70 and ranged from the signal accumulating region 66 to the detecting node section 68.

As shown in FIG. 20, this embodiment has a structure that the well region 62 is formed on the semiconductor substrate 60. A barrier layer 92 which is in contact with both of the signal accumulating region 66 of the photodiode 64 and the detecting node section 68, which constitutes the detecting node section 68 of the drain region 72 of the transistor is formed below the reading gate electrode 70. As a result, the channel-length modulation effect (the drain modulation effect) and punch through can be prevented. To enable the signal charges 74 generated in the signal accumulating region 66 to be read from the signal accumulating region 66 of the photodiode 64, which has completely be depleted, so as to be supplied to the detecting node section 68 by applying a low voltage, ions are implanted into a region above the barrier layer 92 in the channel region so that a channel-formation layer 90 is formed.

Ions are implanted into a region allowed to range from a part of the signal accumulating region 66 to a part of the detecting node section 68. As a result, the channel-formation layer 90 allowed to range from the signal accumulating region 66 to the detecting node section 68 can be formed above the barrier layer 92 in the channel region.

Since the above-mentioned channel-formation layer 90 is formed, the signal charges 74 generated in the signal accumulating region 66 of the photodiode 64 are read through the channel-formation layer 90 serving as the signal reading passage formed as indicated with an arrow C so as to be supplied to the drain region 72.

In the thirteenth embodiment, the barrier layer 92 and the channel-formation layer 90 can be formed by using the same mask. Therefore, the manufacturing process can be simplified. Note that use of the same mask is not required. The structure according to this embodiment is characterized in that the barrier layer 92 is formed below the channel-formation layer 90.

A fourteenth embodiment of the present invention will now be described.

Figure 21:
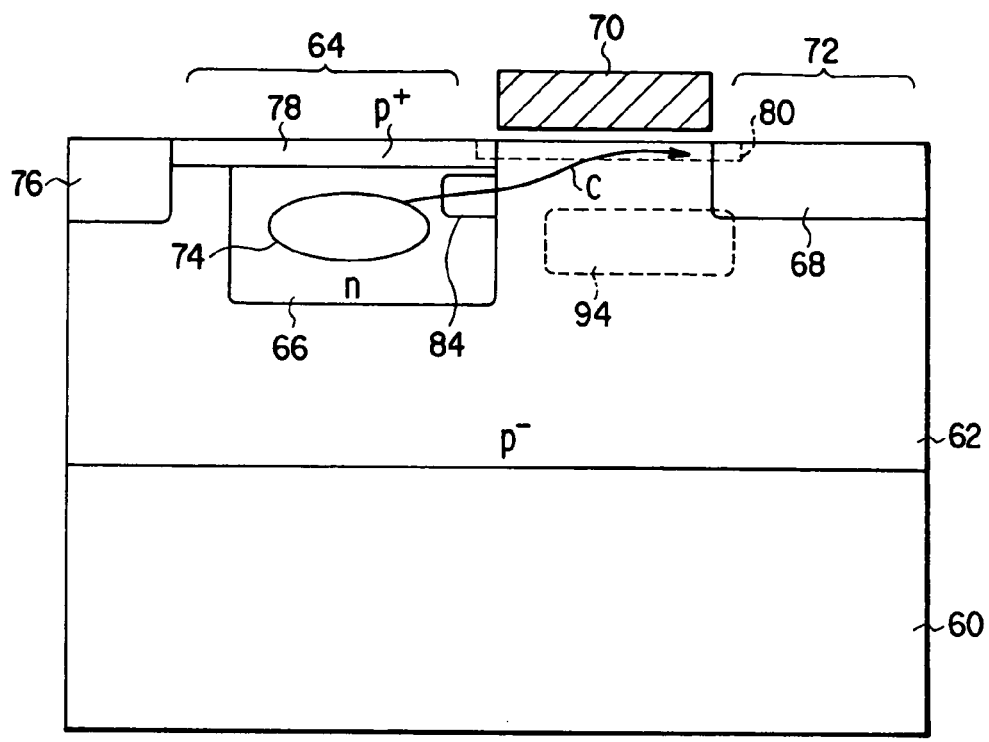
FIG. 21 is a cross sectional view showing an element according to a fourteenth embodiment of the present invention.

FIG. 21 is a cross sectional view showing an element according to a fourteenth embodiment of the present invention.

Also the structure of the fourteenth embodiment is substantially the same as that according to the twelfth embodiment shown in FIG. 19. Note that the difference lies in that the barrier layer 94 is not connected to the signal accumulating region 66 of the photodiode 64.

To prevent extension of a depletion layer from the signal accumulating region 66 which constitutes the drain region 72, the barrier region 94 is connected to a position below the detecting node section 68 which constitutes the drain region 72.

The channel formation layer 84 is formed above the barrier region 94 because of the same reason described in the twelfth embodiment. The channel formation layer 84 is positioned above the barrier region 94 such that a part of the channel formation layer 84 does not extend from the signal accumulating region 66 of the photodiode 64 toward the position below the gate electrode 70. The channel formation layer 84 is limited in the signal accumulating region 66.

The channel formation layer 84 is formed in a small area in the signal accumulating region 66 of the photodiode 64 adjacent to the gate electrode 70.

As a result of the above-mentioned structure, the channel formation layer 84 also serves as a part of the passage through which signals are read in a direction indicated with an arrow C. As a result, the signal reading passage can be maintained.

A self-alignment process is performed after the gate electrode 70 has been performed so that a region (the channel formation layer 84) into which n-type ions for reading signals have been implanted is formed. Therefore, variations of the manufactured MOS solid-state image pickup apparatuses each having the above-mentioned structure can be prevented.

A fifteenth embodiment of the present invention will now be described.

Figure 22:
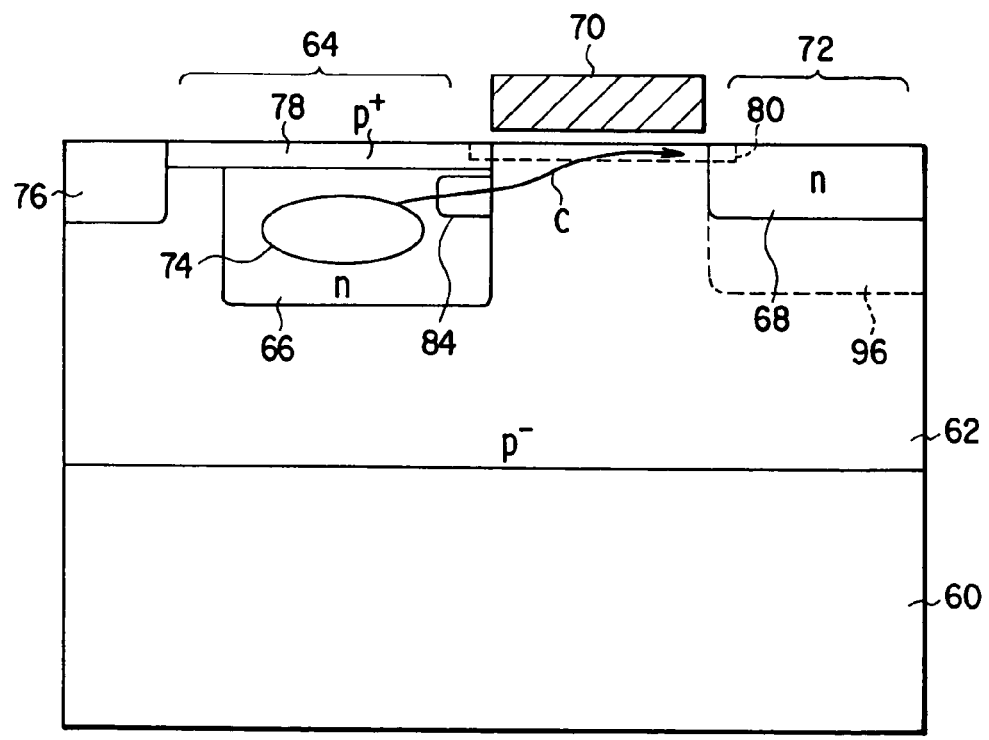
FIG. 22 is a cross sectional view showing the element structure of a modification of the fourteenth embodiment of the present invention.

FIG. 22 is a cross sectional view showing a element according to a fifteenth embodiment of the present invention.

The fifteenth embodiment has a similar structure as that of the fourteenth embodiment shown in FIG. 21. The difference lies in that the barrier region 96 is formed below the detecting node in place of the position below the gate electrode 70. The foregoing structure is able to prevent extension of the depletion layer from the detection node section 68. The other structures are the same as those of the fourteenth embodiment.

As a result of the above-mentioned structure, the channel formation layer 84 also serves as a part of the passage through which signals are read in a direction indicated with an arrow C. As a result, the signal reading passage can be maintained.

Figure 23:
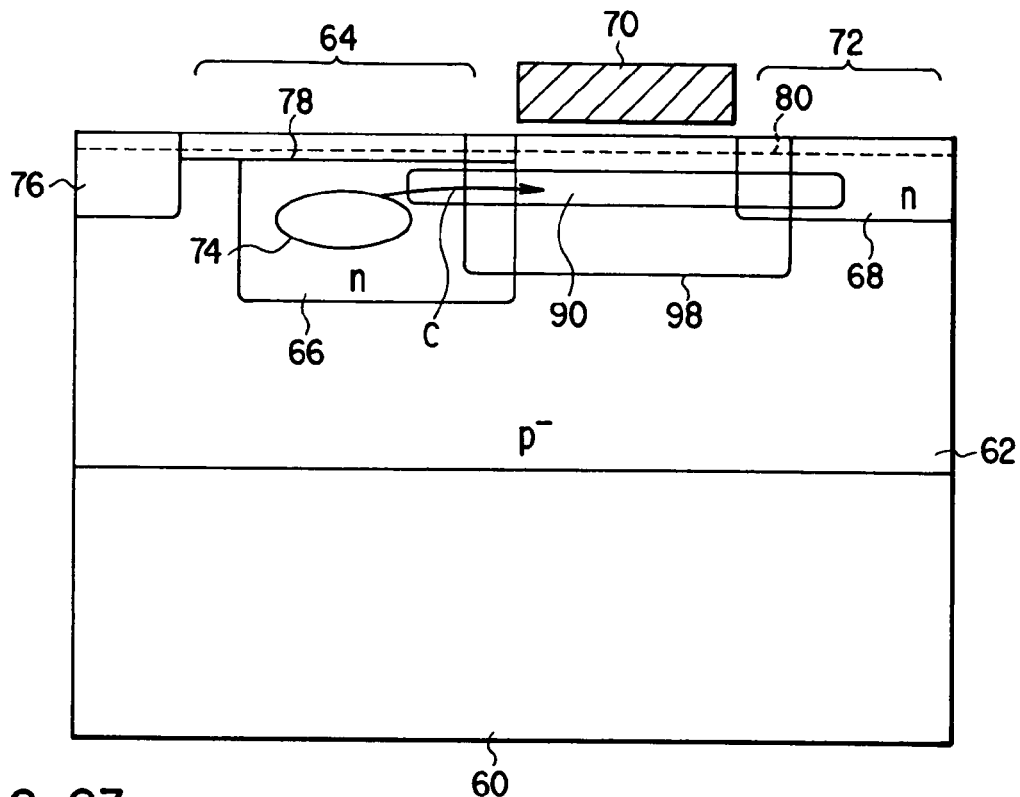
FIG. 23 is a cross sectional view showing an element according to a fifteenth embodiment of the present invention.

FIG. 23 is a cross sectional view showing a element according to a sixteenth embodiment of the present invention.

The structure of this embodiment corresponds to the modification of the thirteenth embodiment shown in FIG. 20. The structure shown in FIG. 23 incorporates a barrier well 98 in place of the barrier layer 92 shown in FIG. 20.

The barrier well 98 is formed in a region including the position below the gate electrode 70 and a part adjacent to the foregoing position. The barrier well 98 is connected to both of the signal accumulating region 66 of the photodiode 64 and the detecting node section 68 for the drain region 72 of the transistor. In the barrier well 98, the channel-formation layer 90 ranges from the signal accumulating region 66 to the detecting node section 68.

Also the above-mentioned structure enables a similar effect obtainable from the thirteenth embodiment to be obtained.

A sixteenth embodiment of the present invention will now be described.

Figure 24:
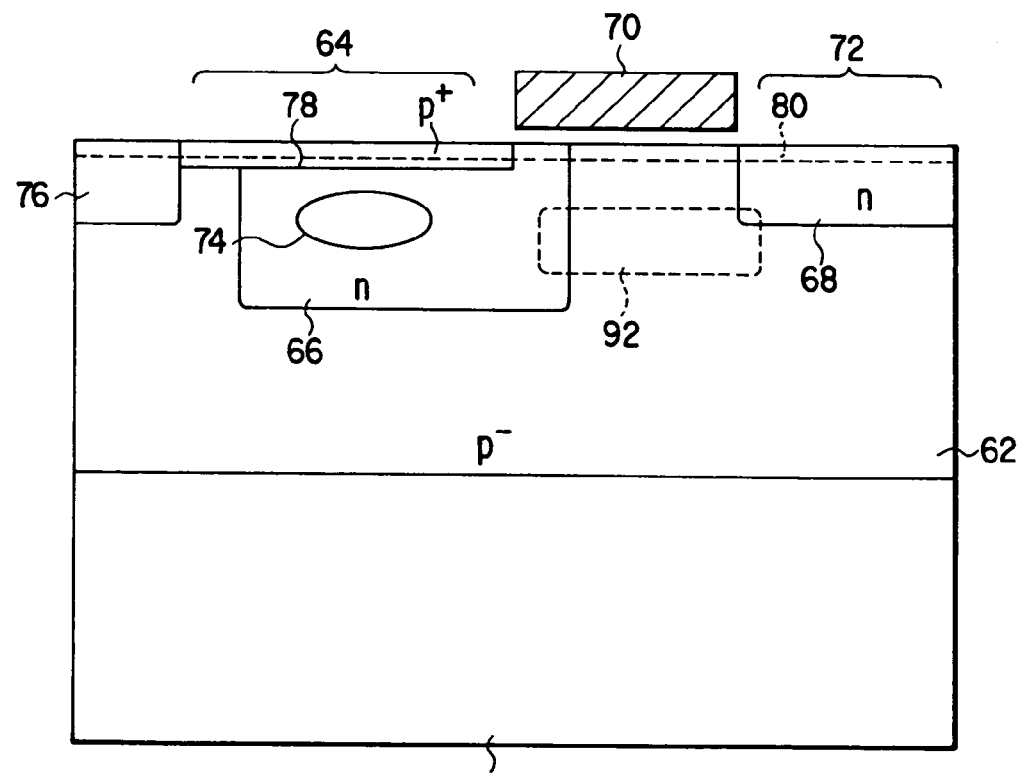
FIG. 24 is a cross sectional view showing an element according to a sixteenth embodiment of the present invention.

FIG. 24 is a cross sectional view showing a element according to the sixteenth embodiment of the present invention.

As shown in FIG. 24, the structure according to the sixteenth embodiment has the low-concentration p-well region 62 formed on the silicon semiconductor substrate 60. The signal accumulating region 66 of the photodiode 64 and the detecting node section 68 for constituting the drain region 72 are formed on the p-well layer 62.

Moreover, the gate electrode 70 is, on the p-well region 62, formed to range from the signal accumulating region 66 of the photodiode 64 to the detecting node section 68 for constituting the drain region 72. A part of the gate electrode 70 extends toward the signal accumulating region 66 such that the gate electrode 70 does not reach the detecting node section 68 for constituting the drain region 72.

A p-type surface shield region 78 is formed above the signal accumulating region 66 of the photodiode 64. The surface shield region 78 is formed by a self-alignment manner by the gate electrode 70, while the signal accumulating region 66 of the photodiode 64 is not formed by the self-alignment manner. Therefore, the portion of the signal accumulating region 66 of the photodiode 64 extends to the position below the gate electrode 70.

Since the structure is employed in which the portion of the signal accumulating region 66 of the photodiode 64 extends to the position below the gate electrode 70, the signal charges 74 generated in the signal accumulating region 66 can be read and supplied to the detecting node section 68 of the drain region 72.

That is, the sixteenth embodiment the signal accumulating region 66 of the photodiode 64 extends to the position below the gate electrode 70 of the transistor. Therefore, the potential of the reading channel can be modulated by the gate electrode 70.

Note that the barrier layer 92 is a required element. Therefore, a structure as shown in FIG. 25 may be employed.

Figure 25:
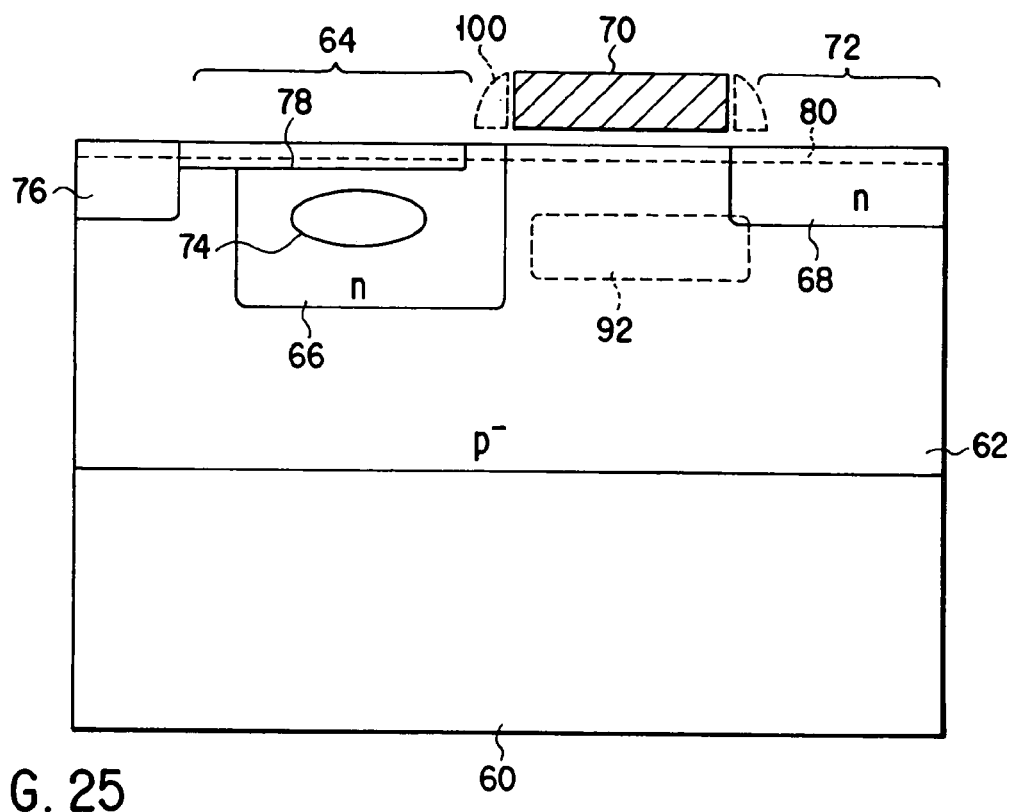
FIG. 25 is a cross sectional view showing an element according to a seventeenth embodiment of the present invention.

FIG. 25 shows the structure of a seventeenth embodiment of the present invention. FIG. 25 is a cross sectional view showing a element having an LDD structure of the MOS transistor. Referring to the drawing, reference numeral 100 represents a side-wall spacer 100 having the LDD structure. The side-wall spacer 100 causes the signal accumulating region 66 to have offset. Thus, the signal charges 74 can be read from the signal accumulating region 66 so as to be supplied to the detecting node section 68 of the drain region 72 through the offset section.

An eighteenth embodiment of the present invention will now be described.

Figure 26:
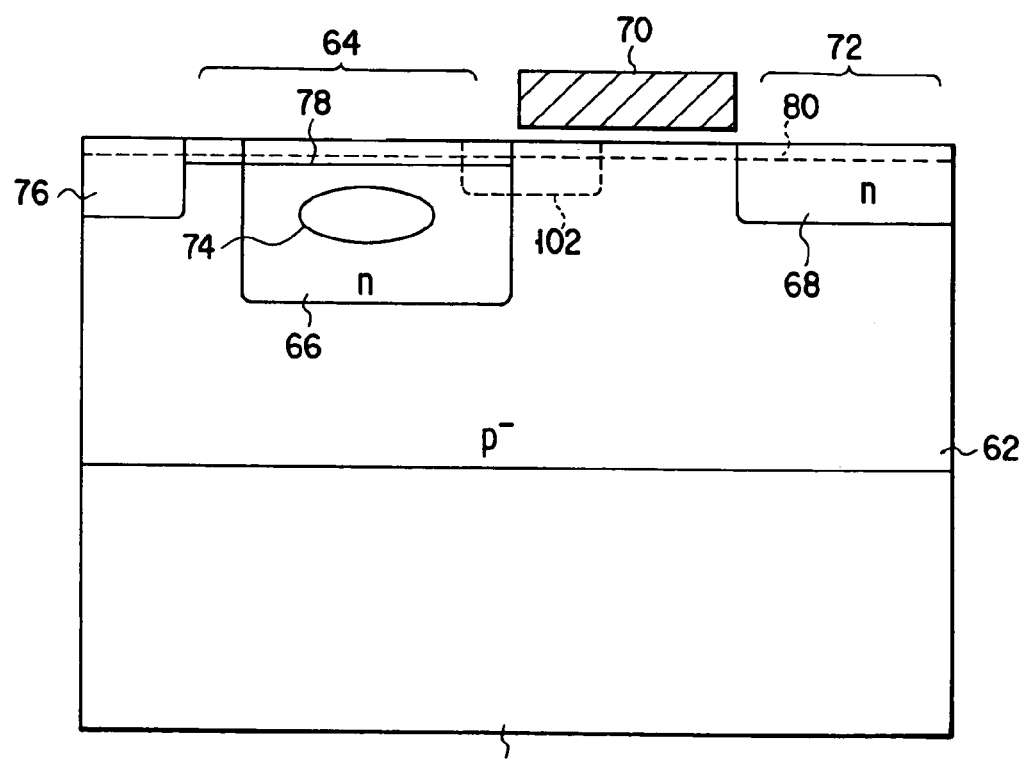
FIG. 26 is a cross sectional view showing an element according to an eighteenth embodiment of the present invention.

FIG. 26 is a cross sectional view showing the structure of a element according to the eighteenth embodiment of the present invention.

As shown in FIG. 26, the eighteenth embodiment has the structure that the low-concentration well region 62 is formed on the silicon semiconductor substrate 60. Moreover, the signal accumulating region 66 for constituting the photodiode 64 and the detecting node section 68 for constituting the drain region 72 of the transistor are formed above the low-concentration well region 62. The gate electrode 70 is, through an insulating layer, formed in a region between the signal accumulating region 66 and the detecting node section 68 formed on the low-concentration well region 62, the gate electrode 70 being formed on the surface of the low-concentration well region 62.

A channel formation layer 102 arranged to cause signals to satisfactorily be read and having the same impurity type as that of the signal accumulating region 66 is, below the gate electrode 70, formed from a part of the signal accumulating region 66 to a position below the gate electrode 70.

In the eighteenth embodiment, the channel formation layer 102 is not formed by the self-alignment manner with respect to the gate electrode 70. This embodiment is characterized in that the channel formation layer 102 is connected to a part below the gate electrode 70 and a part of the surface shield region 78.

The twelfth to eighteenth embodiments has the structure that MOS solid-state image pickup apparatus having the unit pixel, which incorporates the photoelectric conversion photodiode and the reading MOS transistor, to read signal charges from the photodiode through the reading MOS transistor has the gate of the reading MOS transistor, the structure of which is devised. Therefore, even the surface shield structure is able to perform complete transference even with a low voltage of 3.3V or 5.0V.

A nineteenth embodiment of the present invention will now be described.

Figure 27A:
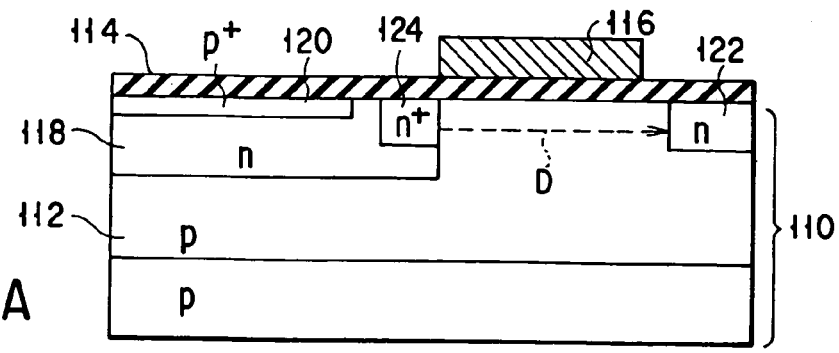
Figure 27B:
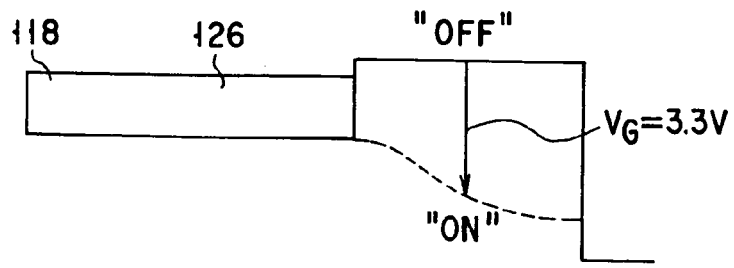
Figure 28:
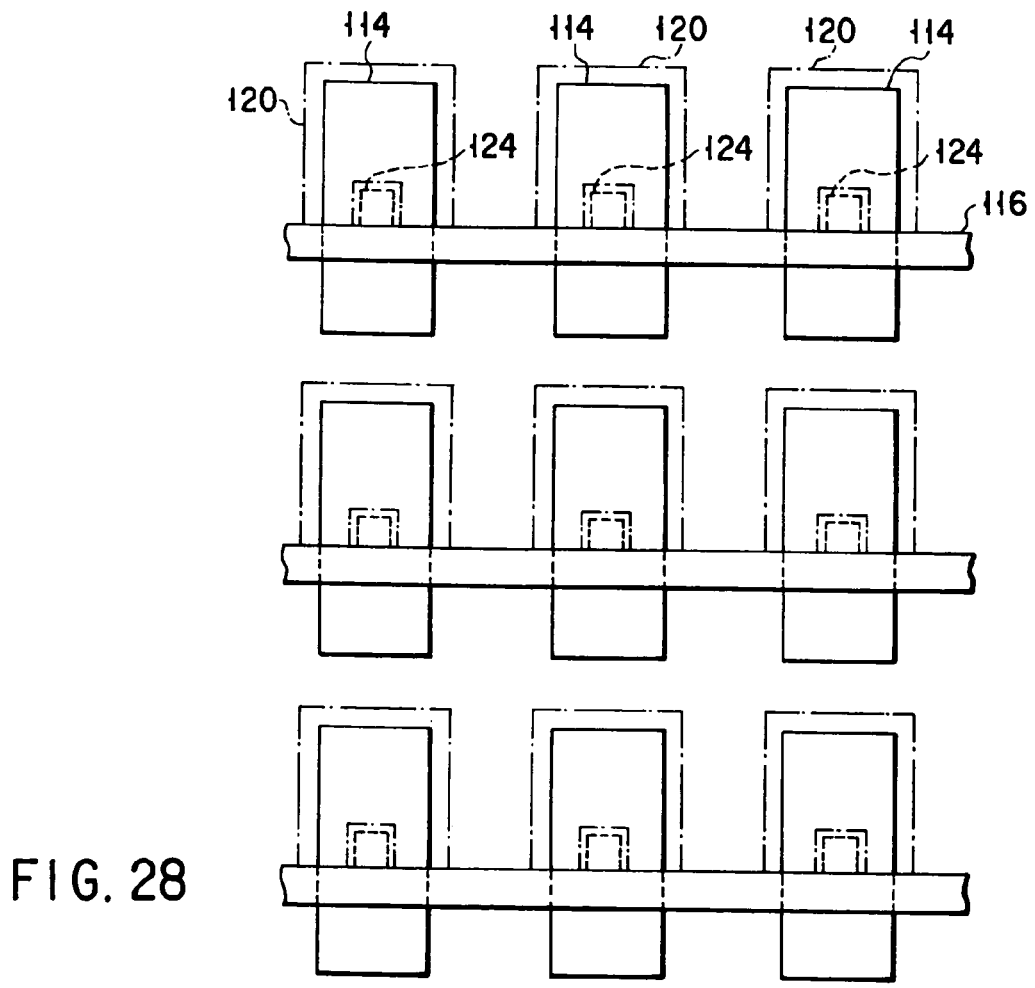
FIG. 28 is a top view showing an example of configuration of image sensors shown in FIG. 27A realized in the pixel.

FIGS. 27A and 27B show a structure in which a solid-state image pickup apparatus according to the nineteenth embodiment is applied to a CMOS image sensor. FIG. 27A is a schematic cross sectional view showing the structure of the cell section. FIG. 27B is a diagram schematically showing potentials in the cell section. FIG. 28 is a diagram showing an example of configuration of image sensors shown in FIG. 27A in the pixel.

The CMOS image sensor according to this embodiment has a p-well region 112 which is embedded in the p-type semiconductor substrate 110 by using diffusion, for example, as shown in FIG. 27A. A gate oxide-film 114 is provided for the surface of the semiconductor substrate (the semiconductor layer) 110 at a position above the p-well region 112. A gate electrode 116 which is a selective reading gate is formed on the surface of the p-type semiconductor substrate 110 through a part of the gate oxide-film 114.

A photodiode layer 118 constituted by an n-type impurity region which receives a light beam signal to photoelectrically convert the signal is provided for the surface of the semiconductor substrate 110 at a position adjacent to the gate electrode 116. The photodiode layer 118 is formed in the self-alignment manner with respect to the gate electrode 116.

A surface shield layer ($p^+$) layer 120 formed by implanting p-type impurity ions at a high concentration is provided for the surface of the photodiode layer 118 in order to prevent depletion of in the surface layer of the photodiode layer 118. The surface shield layer 120 is formed apart from the gate electrode 116 for a predetermined distance.

A detecting node section (an LDD) 122 to which charges read from the photodiode layer 118 by the gate electrode 116 are transferred is provided for the surface of the p-type semiconductor substrate 110 except for the portions in which the gate electrode 116 and the photodiode layer 118 are formed. The detecting node section 122 is formed apart from the photodiode layer 118 for a distance which does not cause the punch through to occur.

An $n^+$ type impurity region 124 arranged to remove a potential barrier caused from the surface shield layer 120 and having a concentration higher than that in the photodiode layer 118 is formed between the gate electrode 116 and the surface shield layer 120. As shown in FIG. 28, the portion of the impurity region 124 adjacent to the gate electrode 116 of the surface shield layer 120 is cut away.

The impurity region 124 is formed in the self-alignment manner with respect to the gate electrode 116. The impurity region 124 shares at least a part of the photodiode layer 118 and includes an end of the photodiode layer 118. In the foregoing case, the impurity region 124 is deeper than the surface shield layer 120 and shallower than the photodiode layer 118.

The impurity region 124 is formed apart from the detecting node section 122 for a distance which does not cause the punch through to occur. Moreover, the impurity region 124 is formed apart from the surface shield layer 120 for a distance which does not cause a junction leak to occur.

In order to prevent surface recombination of the photodiode layer 118, the CMOS image sensor having the surface shield structure may have the structure that the impurity region 124 is formed between the gate electrode 116 and the surface shield layer 120. Thus, charges accumulated in the photodiode layer 118 can easily be read.

That is, the provided impurity region 124 is able to prevent formation of a potential barrier at a position between the photodiode layer 118 and the detecting node section 122 caused by the surface shield layer 120. As a result, for example, as shown in FIG. 27B, all of charges 126 accumulated in the photodiode layer 118 can reliably be read as indicated with an arrow D shown in the drawing even if the reading voltage $V_G$ which is applied to the gate electrode 116 is a low voltage of, for example, 3.3V. Thus, the read charges 126 are transferred to the detecting node section 122.

Figure 29:
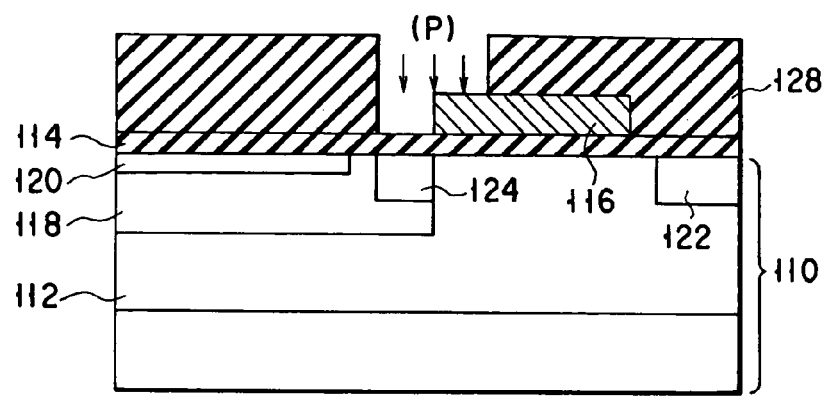
FIG. 29 is a schematic cross sectional view showing a cell section to describe a method of manufacturing an impurity region of a CMOS image sensor according to a nineteenth embodiment of the present invention.

FIG. 29 shows a method of forming the impurity region 124 of the CMOS image sensor having the above-mentioned structure.

When the impurity region 124 is formed, a method substantially the same as the conventional method is employed to form the detecting node section 122 and so forth. Then, the photoresist 128 is used to serve as a mask to implant n-type impurities, such as phosphor (P) ions, arsenic (As) ions, to a predetermined depth. At this time, the impurity region 124 is formed in a self-alignment manner with respect to the gate electrode 116. The impurity region 124 is formed apart from the detecting node section 122 for a distance which does not cause the punch through to occur and apart from the surface shield layer 120 for a distance which does not cause a junction leak to occur.

The CMOS image sensor having the structure shown in FIGS. 27A and 27B enables a surface shield structure to easily be formed without a necessity of considerably changing the conventional manufacturing process.

As described above, formation of a potential barrier caused by the surface shield layer can be prevented. That is, the CMOS image sensor having the surface shield structure is formed such that the impurity region is formed between the reading gate and the surface shield layer in order to prevent surface recombination of the photodiode layer. As a result, formation of a potential barrier between the photodiode layer and the detecting node section caused from the surface shield layer can be prevented. Thus, all of charges accumulated in the photodiode layer can satisfactorily be read even with a low voltage. Therefore, the reading voltage for reading charges accumulated in the photodiode region can be lowered. As a result, a satisfactory CMOS image sensor using a single power source and low operating voltage can be manufactured.

Moreover, the above-mentioned structure enables the surface shield layer provided for preventing surface recombination of the photodiode layer to attain effects of preventing damage and lowering a dark current.

In the nineteenth embodiment, the impurity region deeper than the surface shield layer and shallower than the photodiode layer is formed between the reading gate and the surface shield layer in the self-alignment manner with respect to the reading gate. The present invention is not limited to the foregoing structure. For example, an impurity region deeper than the photodiode layer and shallower than the p-well region may be formed. Another structure may be employed in which a part of the impurity region extends to a position below the reading gate. In either case, all charges can be read.

Also the pixel according to the nineteenth embodiment shown in FIG. 27A may be provided with a barrier layer to prevent the problems of the punch through.

Figure 30A:
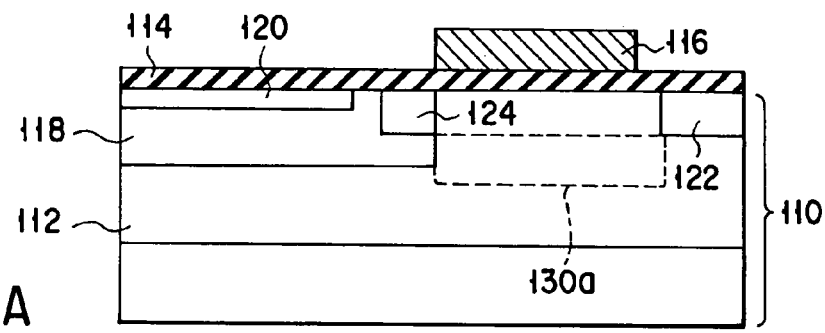
FIG. 30A is a schematic cross sectional view showing the structure of a cell section of a CMOS image sensor according to a first modification of the nineteenth embodiment.
Figure 30B:
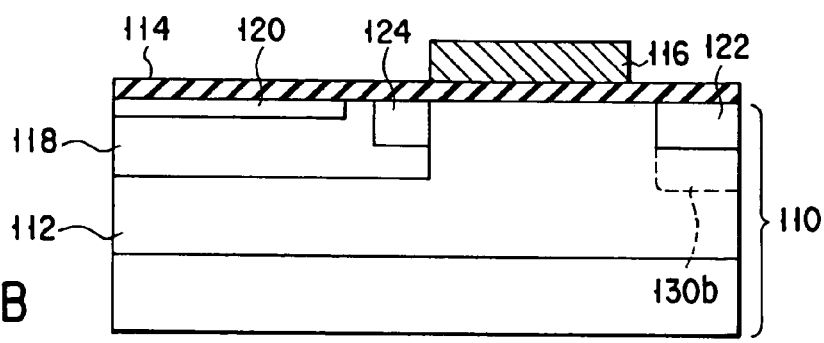
FIG. 30B is a cross sectional view showing the structure of a cell section of a CMOS image sensor according to a second modification of the nineteenth embodiment.

FIGS. 30A and 30B show first and second modifications of the nineteenth embodiment.

The first modification shown in FIG. 30A is provided with a (p-type and high concentration) barrier layer 130a having the same conduction type as that of the semiconductor substrate 110 and a concentration higher than that in the p-type semiconductor substrate 110 and formed below the gate electrode 116. Thus, depletion layers extending from the photodiode layer 118 and the detecting node section 122 can be prevented.

As shown in FIG. 30B, a (p-type and high concentration) barrier layer 130b having the same conduction type as that of the p-type semiconductor substrate 110 and a concentration higher than that of the p-type semiconductor substrate 110 may be formed adjacent to a position below the detecting node section 122 in place of the position below the gate electrode 116. Also the foregoing structure is able to prevent the depletion layers extending from the detecting node section 122.

The barrier layers 130a and 130b may be applied to any one of the twentieth to twenty-seventh embodiments below.

A twentieth embodiment of the present invention will now be described.

Figure 31:
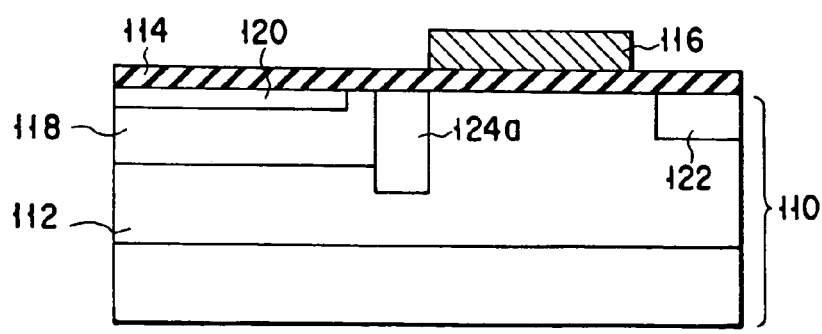
FIG. 31 is a schematic cross sectional view showing the structure of a cell section of a CMOS image sensor according to twentieth embodiment of the present invention.

FIG. 31 is a diagram showing the schematic structure of a CMOS image sensor according to the twentieth embodiment of the present invention.

The CMOS image sensor has a structure in which an impurity region 124a deeper than the photodiode layer 118 and shallower than the p-well region 112 is formed in the self-alignment manner with respect to the gate electrode 116.

Also the CMOS image sensor having the above-mentioned structure enables a similar effect obtainable from the CMOS image sensor according to the nineteenth embodiment to be obtained.

Figure 32:
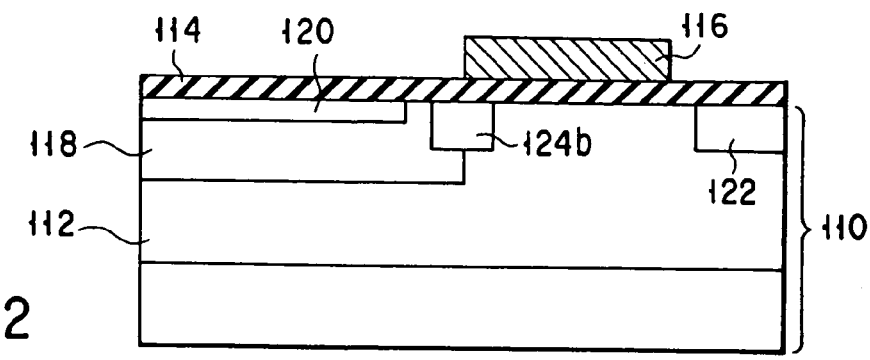
FIG. 32 is a schematic cross sectional view showing the structure of a cell section of a CMOS image sensor according to twenty-first embodiment of the present invention.

FIG. 32 is a diagram showing the schematic structure of a CMOS image sensor according to a twenty-first embodiment of the present invention.

The CMOS image sensor according to the twenty-first embodiment has a structure that, for example, an impurity region 124b deeper than the surface shield layer 120 and shallower than the photodiode layer 118 is formed below the gate electrode 116 such that the position of the impurity region 124b is shifted to overlap the gate electrode 116.

In the foregoing case, the impurity region 124b is formed apart from the detecting node section 122 for a distance which does not cause the punch through to occur before the gate electrode 116 is formed. Thus, the foregoing structure can easily be formed.

Also the above-mentioned CMOS image sensor enables a similar effect obtainable from the CMOS image sensor according to the nineteenth embodiment to be obtained.

In particular, this embodiment having the structure that the position of the impurity region 124b is shifted enables the area of the surface shield layer 120 which covers the surface of the photodiode layer 118 to be enlarged. Therefore, further satisfactory effects of preventing damage and lowering of a dark current caused from the surface shield layer 120 can be obtained.

Figure 33:
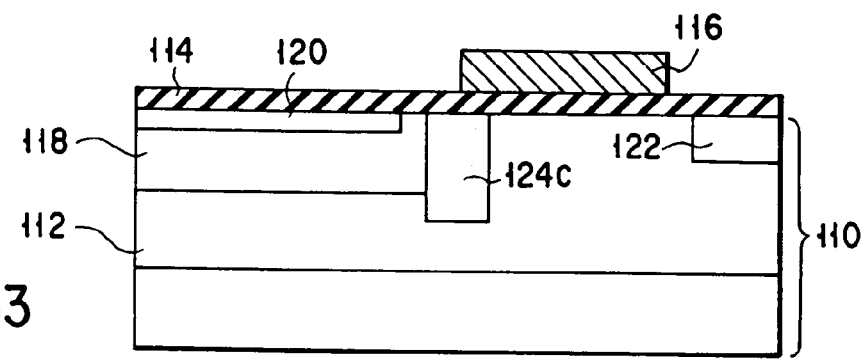
FIG. 33 is a schematic cross sectional view showing the structure of a cell section of a CMOS image sensor according to twenty-second embodiment of the present invention.

FIG. 33 is a diagram showing the schematic structure of a CMOS image sensor according to a twenty-second embodiment of the present invention.

The CMOS image sensor according to the twenty-second embodiment has a structure that, for example, an impurity region 124c deeper than the photodiode layer 118 and shallower than the p-well region 112 is formed below the gate electrode 116 such that the position of the impurity region 124c is shifted to overlap the gate electrode 116.

Also in the foregoing case, the impurity region 124c is formed apart from the detecting node section 122 for a distance which does not cause the punch through to occur before the gate electrode 116 is formed. Thus, the foregoing structure can easily be formed.

Also the above-mentioned CMOS image sensor enables a similar effect obtainable from the CMOS image sensor according to the twenty-first embodiment to be obtained.

Figure 34:
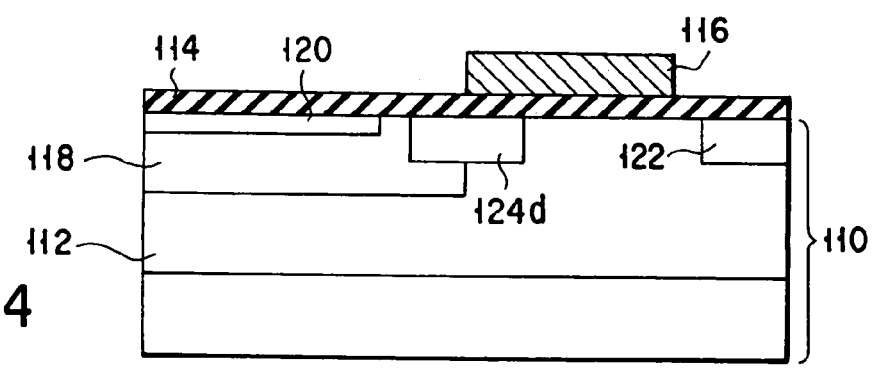
FIG. 34 is a schematic cross sectional view showing the structure of a cell section of a CMOS image sensor according to twenty-third embodiment of the present invention.

FIG. 34 is a diagram showing the schematic structure of a CMOS image sensor according to a twenty-third embodiment of the present invention.

The CMOS image sensor according to this embodiment incorporates an impurity region 124d deeper than the surface shield layer 120 and shallower than the photodiode layer 118 is formed to extend to a position below the gate electrode 116.

In the foregoing case, the impurity region 124d is formed apart from the detecting node section 122 for a distance which does not cause the punch through to occur before the gate electrode 116 is formed. Thus, the foregoing structure can easily be formed.

Also the CMOS image sensor having the above-mentioned structure enables a similar effect obtainable from the CMOS image sensor according to the nineteenth embodiment to be obtained.

In particular, the above-mentioned structure enables the size of the impurity region 124d to be modified by the gate electrode 116. Therefore, charges can advantageously be read (satisfactory controllability can be obtained).

Figure 35:
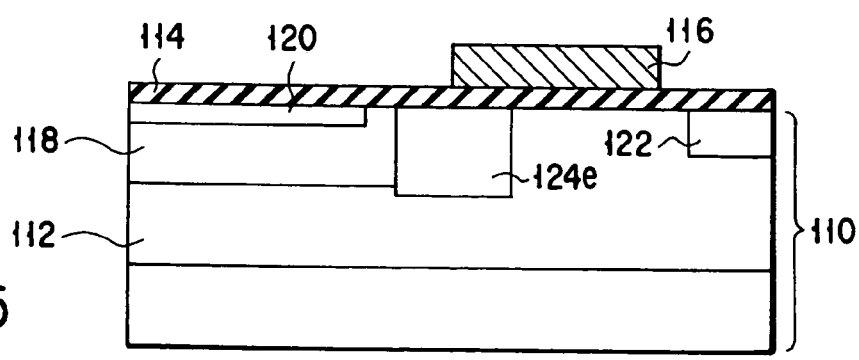
FIG. 35 is a schematic cross sectional view showing the structure of a cell section of a CMOS image sensor according to twenty-fourth embodiment of the present invention.

FIG. 35 is a diagram showing the schematic structure of a CMOS image sensor according to a twenty-fourth embodiment of the present invention.

The CMOS image sensor according to this embodiment has a structure that an impurity region 124e deeper than the photodiode layer 118 and shallower than the p-well region 112 is formed to extend to a position below the gate electrode 116.

In the foregoing case, the impurity region 124e is formed apart from the detecting node section 122 for a distance which does not cause the punch through to occur before the gate electrode 116 is formed. Thus, the above-mentioned structure can easily be formed.

Also the CMOS image sensor having the above-mentioned structure enables a similar effect obtainable from the CMOS image sensor according to the twenty-third embodiment to be obtained.

Although all of the nineteenth to twenty-fourth embodiments have the structure that the present invention is applied to the CMOS image sensor, the present invention is not limited to this. For example, the present invention may be applied to a CCD.

A twenty-fifth embodiment of the present invention will now be described.

Figure 36A:
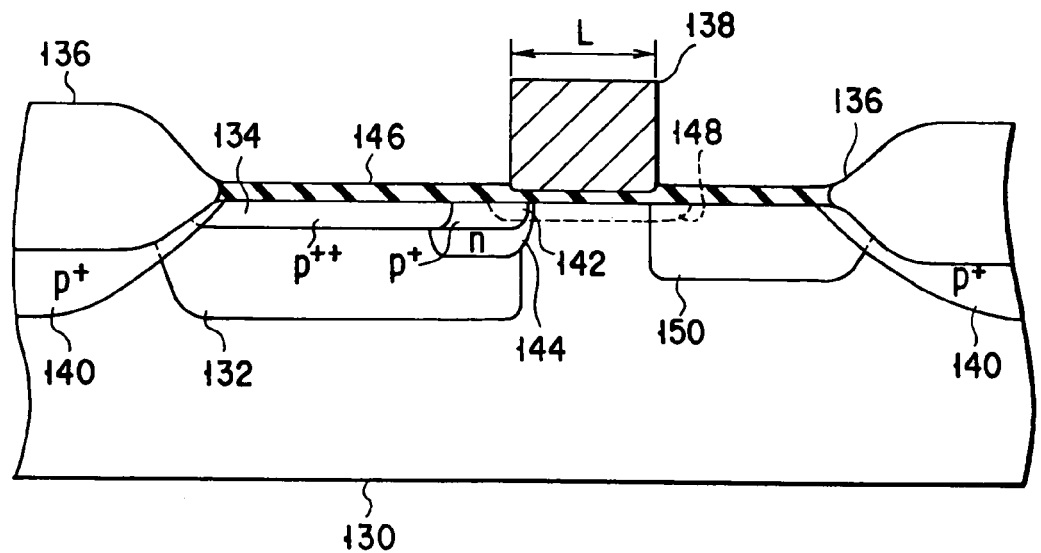
Figure 36B:
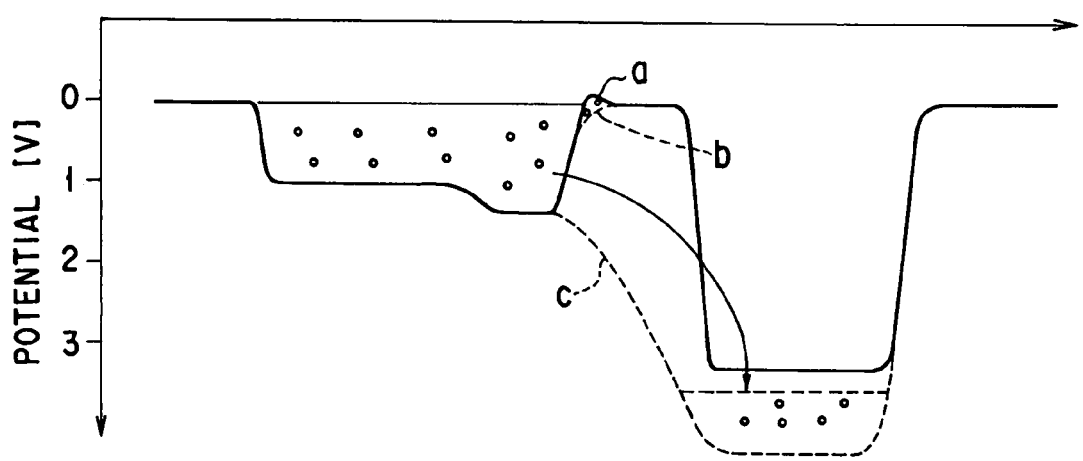

FIGS. 36A and 36B are diagrams showing an essential part of a solid-state image pickup apparatus according to a twenty-fifth embodiment of the present invention. FIG. 36A is a cross sectional view of a cell section of the solid-state image pickup apparatus. FIG. 36B is a diagram showing potentials realized when the gate voltage has been applied and when the gate voltage is not applied.

Referring to FIG. 36A, a photodiode n-region 132 which is a photodiode region is formed on a p-well 130 formed on a P-substrate (not shown) or an N-substrate (not shown). A photodiode $p^{++}$ region 134 for eliminating an influence of an interface between silicon and an oxide film is formed on the photodiode n-region 132.

An end of the photodiode $p^{++}$ region 134 is in contact with the LOCOS element-isolation region 136, while another end is not in contact with the end of the gate electrode 138. That is, the foregoing end is, adjacent to the end of the LOCOS element-isolation region 136, in contact with a $p^+$ region 140 which is formed below the LOCOS element-isolation region 136. The other end adjacent to the gate electrode 138 is in contact with a photodiode $p^+$ region 142, the concentration of which is lower than that in the photodiode $p^{++}$ region 134.

In general, concentration A of the photodiode $p^{++}$ region 134 is about $5\times10^{18}$ to about $5\times10^{19}$. On the other hand, concentration B of the photodiode $p^+$ region 142 must be lower than the concentration A. It is preferable that the concentration B is $5 \times 10^{18}$ to $2 \times 10^{17}$. An ion implantation region 144 may be formed below the photodiode p+ region 142.

An ion implantation region 148 for determining the threshold value of the MOS transistor is formed below the reading gate electrode 138 through an insulating film 146. A drain region 150, which is a signal detecting region, is formed below the other end of the reading gate electrode 138 to receive signal charges in the photodiode n-region 132. A LOCOS element-isolation region 136 is formed adjacent to an end of the drain region 150 through a element-isolating p+ region 140. Note that the gate length L of the gate electrode 138 is, for example, 0.7 μm.

In the above-mentioned structure, a voltage of 3.3V, which is lower than the reading voltage of 15V for the CCD, is applied to the gate electrode 138. That is, signal charges in the photodiode n-region 132 must be, at 3.3V, read and supplied to a drain region 150 of the reading gate. To read the signal charges, the channel potential of the reading gate must be modulated by the gate electrode 138.

However, the actual concentration of the p-well 130 is about $1 \times 10^{15}$ to about $2 \times 10^{17}$. On the other hand, the concentration A of the photodiode p++ region 134 for electrically shielding the interface between the silicon and the oxide film is a very high level of about $5 \times 10^{18}$ to about $5 \times 10^{19}$. If the difference between the concentration of the p-well 130 and the concentration A of the photodiode p++ region 134 is about two digits, the channel cannot be opened even if 3.3V is applied to the gate electrode 138 in a case where the photodiode p++ region 134 is extended to the position below the reading gate electrode 138.

If the photodiode p+ region 142 having a concentration lower than the high concentration A of the photodiode p++ region 134 is formed adjacent to the gate electrode 138 as shown in FIG. 36A, the interface between silicon and the oxide film can be shielded by the first-conduction-type (the p-type) region. Therefore, the channel of the reading gate can furthermore be modulated. The foregoing fact is indicated with symbols a and b shown in FIG. 36B showing potentials. Symbol a represents a designed potential when concentration B of the photodiode p+ region 142≈concentration A. Symbol b represents a designed potential according to the present invention.

Since the concentration B is a relatively low level as compared with the concentration A, the potential of the interface between silicon and the oxide film is lowered owing to the concentration B of the photodiode p+ region 142 as indicated with the symbol b. The foregoing region is the region indicated with the symbol b, formed between the gate electrode 138 and the photodiode n-region 132 and having a low potential.

Since the concentration B of the photodiode p+ region 142 is lower than the concentration A of the photodiode p++ region 134, modulation can be performed by the gate electrode 138. That is, signal charges in the photodiode n-region 132 can be read and supplied to the drain region 150.

Moreover, the difference between the concentrations A and B enables a potential gradient to be realized in a direction from the photodiode toward the reading gate electrode 138 shown in FIG. 36A. The potential gradient enables signals to be read. In addition, signal charges undesirably left in the photodiode region can be eliminated. Since the photodiode p+ region 142 is able to shield the potential of the foregoing portion, occurrence of a leak current from the interface between silicon and the oxide film can be prevented.

That is, two or more types of the structures for shielding the interface enable signal charges in the photodiode n-region 132 of the photodiode to completely be read and supplied to the drain region 150 of the MOS transistor while the potential at the interface between silicon and the oxide film is being shielded.

When the concentration B in the photodiode p+ region 142 is controlled, the degree of modulation for the ion implantation region 144 which is performed by the reading gate electrode 138 can be raised. The raised degree of modulation enables signals to be read as indicated with symbol c when the reading gate is turned on. The reason for this lies in that the concentration B of the photodiode p+ region 142 is made to be lower than the concentration A of the photodiode p++ region 134.

Note that symbol c indicates the potential of the reading gate section when the ion implantation region 148 has been turned on. The potential gradient deepened in a direction from the photodiode section toward the gate electrode 138 can be realized by only the photodiode p++ region 134. However, a combination of the photodiode p+ region 142 and the ion implantation region 144 formed below the photodiode p+ region 142 enables the foregoing potential gradient to be realized.

Although the P+ region 142 and the P++ region 134 are separated from each other in FIG. 36A, concentration gradient is, in actual, formed between the two regions. Since diffusion takes place because of the heating process, an apparent boundary is not formed. In this case, the concentration gradient is formed.

The concentration gradient will now be described.

The two steps of concentration gradient in the P region in the photodiode can be formed as follows: the gate is thinly oxidized after the reading gate has been formed. Then, a first P region (a region adjacent to the reading gate) of the photodiode is formed by means of ion implantation or the like. Then, a "side wall" structure is formed. The "side wall" structure can be formed by any one of a variety of methods. One of the methods will now be described, in which polysilicon or the like is evaporated, followed by performing etching, such as RIE. Thus, polysilicon is left on only the side wall of the gate. Another method may be employed in which a CVD film is evaporated, and then etching, for example, RIE, is performed. Thus, the CVD film is left on only the side wall of the reading gate. The side wall may be provided for only the photodiode or the right and left portions of the gate. In the state in which the side wall made of polysilicon or in the form of the CVD film has been formed on the side wall of the reading gate, ions are implanted into a P region of the second photodiode.

As a result, no ion-implantation region is formed in the lower portion of the side wall portion. As a result, the P region having the two steps of the concentration gradient can be provided for the photodiode.

Since a heating process is, in actual, performed after the second ion implantation process, the region having the two steps of the concentration gradient encounters diffusion of impurities from a high concentration region to a low concentration region. As a result, an apparent concentration distribution having the two steps of concentration gradient is not formed. In this case, a surface shield layer having a moderate concentration gradient is formed.

A twenty-sixth embodiment of the present invention will now be described.

Figure 37A:
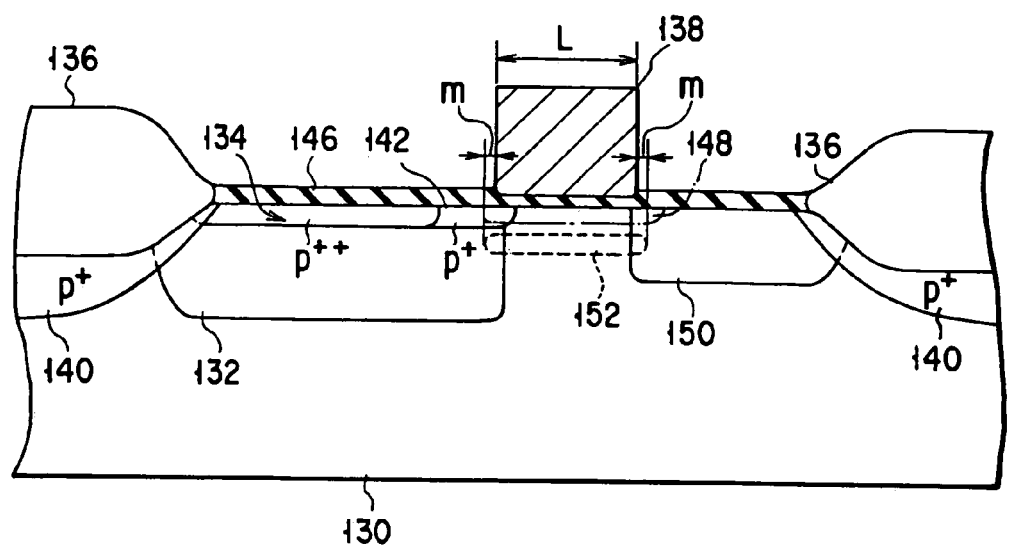
Figure 37B:
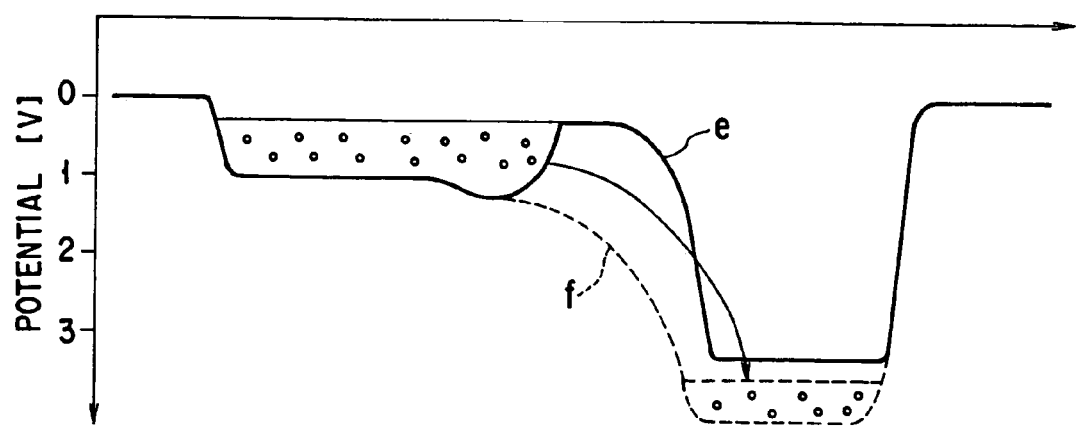

FIGS. 37A and 37B show the structure of an essential part of a solid-state image pickup apparatus according to the twenty-sixth embodiment of the present invention. FIG. 37A is a cross sectional view of a cell section of the solid-state image pickup apparatus. FIG. 37B is a graph showing potentials realized when the gate voltage is applied and when the gate voltage is not applied.

The twenty-sixth embodiment has a structure that a ion implanting section 152 is substituted for the ion implantation region 144 according to the twenty-fifth embodiment shown in FIG. 36A. The ion implanting section 152 is formed below the gate electrode 138 at a position below the ion implantation region 148. The ion implanting section 152 projects over, for example, each of the two ends of the reading gate electrode 138 by about m μm (m=0.2 μm) in this embodiment.

Referring to FIG. 37B, symbol e represents a designed potential when the channel is "OFF" and f represents a potential when the channel is "ON" after the ion implantation regions 148 and 152 have been formed.

Since the ion implanting section 152 is formed, the reading gate can be formed into a depletion type structure to 0.0V to −0.6V. Since the depletion type structure reads signal charges in the photodiode n-region 132 through silicon, interface noise produced at the interface of the MOS transistor or an influence of thermal noise can be prevented.

Figure 38A:
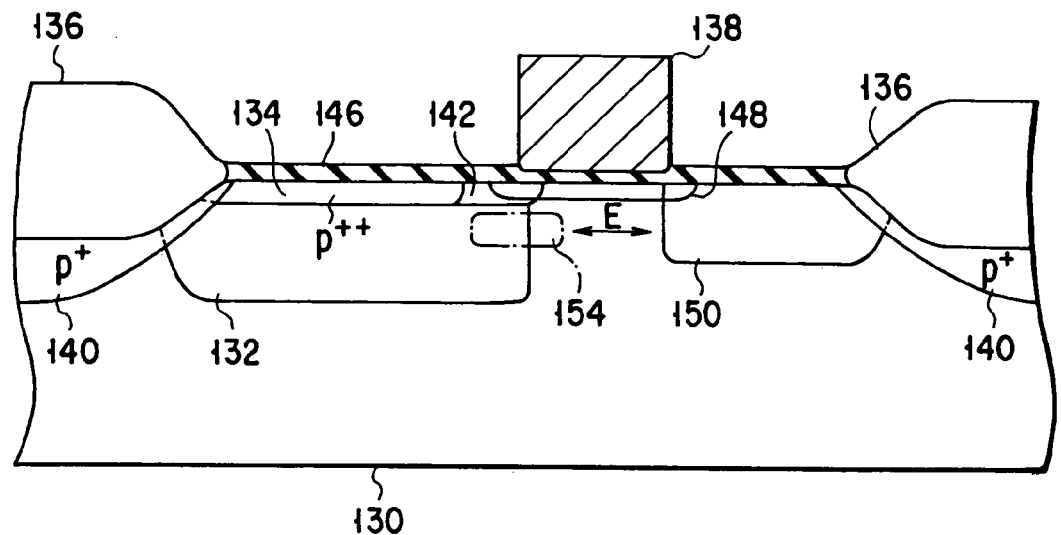
Figure 38B:
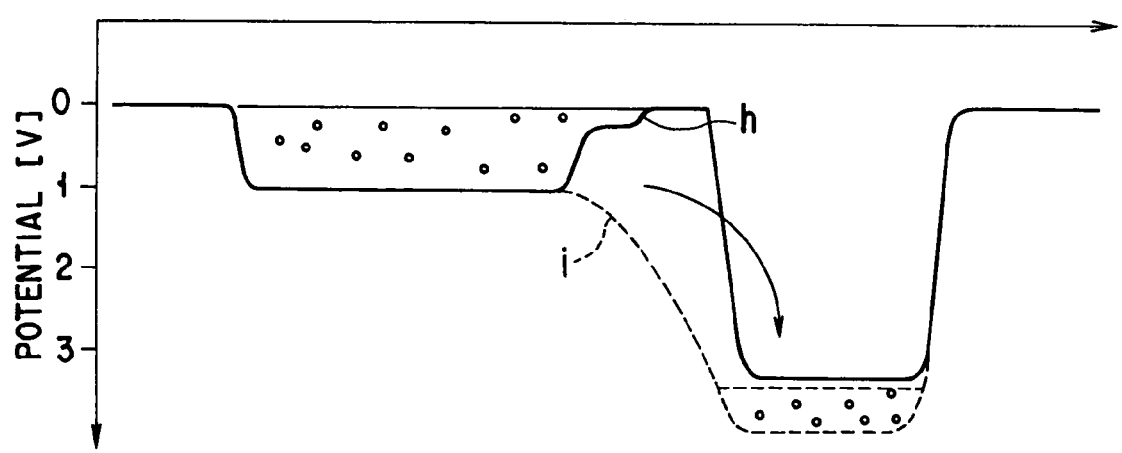

FIGS. 38A and 38B show an essential part of a twenty-seventh embodiment of the solid-state image pickup apparatus according to the present invention. FIG. 38A is a cross sectional view showing a cell section of the solid-state image pickup apparatus. FIG. 38B shows the potential realized when the gate voltage is applied and when the gate voltage is not applied.

The twenty-seventh embodiment has a structure incorporating an ion implanting region 152 shown in FIG. 37A and formed as an ion implantation region 154 positioned below the reading gate electrode 138. Signal charges in the photodiode n-region 132 are able to pass through the ion implantation region 154.

A region indicated with symbol E can be changed by the gate electrode 138. Therefore, when signal charges are read from the photodiode n-region 132 to the ion implantation region 154, the signal charges can immediately be read to the drain region 150 by turning the gate electrode 138 on.

Referring to FIG. 38B, symbol h represents a designed potential of the portion serving as the channel in a state of "OFF" and symbol i represents a potential in a state of "ON" after the ion implantation regions 148 and 154 have-been formed.

It is important that the concentration B of the photodiode p$^+$ region 142 in the first-conduction-type interface shield region is made to be lower than the concentration A of the photodiode p$^{++}$ region 134 which is another interface shield to enable signal charges in the photodiode n-region 132 to be read with the low voltage of 3.3V.

The second-conduction-type ion implantation region 154 is formed in a part below the reading gate electrode 138 so that the region, in which signal charges are accumulated, is extended to the region E which can be modulated by the gate electrode 138. As a result, signal charges in the photodiode n-region 132 can be read and supplied to the drain region 150.

In each of the twenty-fifth to twenty-seventh embodiments, a barrier layer for preventing depletion layers extending from the photodiode p$^{++}$ region 134 and the drain region 150 may be formed below the gate electrode 138. The barrier layer may be formed adjacent to the position below the drain region 150 in place of the position below the gate electrode 138.

As described above, the CMOS solid-state image pickup apparatus is enabled to read signal charges in the photodiode with a low voltage.

It is understood that the present disclosure of the preferred form can be changed in the details of construction and in the combination and arrangement of parts.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A solid-state image pickup apparatus which incorporates a semiconductor substrate having an image pickup region including unit pixels disposed in a two-dimensional configuration and signal scanning sections for reading signals from the unit pixels in the image pickup region, the solid-state image pickup apparatus comprising:
    a photoelectric conversion region having a first-conduction-type signal accumulating section formed at a position apart from a top surface of the semiconductor substrate in a direction of a depth of the semiconductor substrate for a predetermined distance and arranged to accumulate signal charges obtained from photoelectric conversion;
    a gate electrode of a first-conduction-type MOS field effect transistor formed adjacent to the photoelectric conversion region and arranged to discharge a signal charge from the first-conduction-type signal accumulating section;
    a first-conduction-type detecting node section serving as a drain region for receiving the signal charges from the photoelectric conversion region via the gate electrode; and
    a barrier layer formed at least close to a lower part of the first-conduction-type detecting node section of the MOS field effect transistor, wherein
    at least a part of the first-conduction-type signal accumulating section in a direction of a channel thereof extends to overlap the gate electrode in a direction in which signals are discharged,
    modulation of the potential of the gate electrode is used to discharge signals from the first-conduction-type signal accumulating section through the channel of the MOS field effect transistor, and
    the first-conduction-type detecting node section is not located below the gate electrode but at a second side of the gate electrode opposite to a first side of the gate electrode formed adjacent to the photoelectric conversion region.

2. A solid-state image pickup apparatus according to claim 1, further comprising a diffusion-layer region which is formed adjacent to the top surface of the semiconductor substrate above the first-conduction-type signal accumulating section, which has a second-conduction-type opposite to the conduction type of the first-conduction-type signal accumulating section and which contains impurities at a concentration which is higher than the concentration of impurities contained in the channel region of the first-conduction-type MOS field effect transistor.

3. A solid-state image pickup apparatus according to claim 2, wherein a length of a portion of the first-conduction-type signal accumulating section extending to overlap the gate electrode in the direction in which signals are discharged is shorter than ½ of a length of the gate electrode of the first-conduction-type MOS field effect transistor.

4. A solid-state image pickup apparatus according to claim 3, wherein the first-conduction-type signal accumulating section has a first region formed below the gate electrode and a second region formed at a position except for a position below the gate electrode, and a depth of the first-conduction-type signal accumulating section in the first region from the top surface of the substrate is smaller than a depth of the first-conduction-type signal accumulating section in the second region.

5. A solid-state image pickup apparatus according to claim 2, wherein a length of a portion of the first-conduction-type signal accumulating section extending to overlap the gate electrode in the direction in which signals are discharged is longer than ½ of a depth of a junction of the diffusion-layer region from the top surface of the semiconductor substrate.

6. A solid-state image pickup apparatus according to claim 5, wherein the first-conduction-type signal accumulating section has a first region formed below the gate electrode and a second region formed at a position except for a position below the gate electrode, and a depth of the first-conduction-type signal accumulating section in the first region from the top surface of the substrate is smaller than a depth of the first-conduction-type signal accumulating section in the second region.

7. A solid-state image pickup apparatus according to claim 2, wherein the first-conduction-type signal accumulating section has a first region formed below the gate electrode and a second region formed at a position except for a position below the gate electrode, and a depth of the first-conduction-type signal accumulating section in the first region from the top surface of the substrate is smaller than a depth of the first-conduction-type signal accumulating section in the second region.

8. A solid-state, image pickup apparatus according to claim 1, wherein a length of a portion of the first-conduction-type signal accumulating section extending to overlap the gate electrode in the direction in which signals are discharged is shorter than ½ of a length of the gate electrode of the first-conduction-type MOS field effect transistor.

9. A solid-state image pickup apparatus according to claim 8, wherein the first-conduction-type signal accumulating section has a first region formed below the gate electrode and a second region formed at a portion except for a position below the gate electrode, and a depth of the first-conduction-type signal accumulating section in the first region from the top surface of the substrate is smaller than a depth of the first-conduction-type signal accumulating section in the second region.

10. A solid-state image pickup apparatus according to claim 1, wherein the first-conduction-type signal accumulating section has a first region formed below the gate electrode and a second region formed at a position except for a position below the gate electrode, and a depth of the first-conduction-type signal accumulating section in the first region from the top surface of the semiconductor substrate is smaller than a depth of the first-conduction-type signal accumulating section in the second region.

* * * * *